(12) United States Patent
Hata et al.

(10) Patent No.: US 8,085,825 B2
(45) Date of Patent: Dec. 27, 2011

(54) METHOD OF FABRICATING SEMICONDUCTOR LASER DIODE APPARATUS AND SEMICONDUCTOR LASER DIODE APPARATUS

(75) Inventors: Masayuki Hata, Kadoma (JP);
Yasumitsu Kunoh, Hirakata (JP);
Yasuyuki Bessho, Uji (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 12/043,724

(22) Filed: Mar. 6, 2008

(65) Prior Publication Data

US 2008/0219309 A1    Sep. 11, 2008

(30) Foreign Application Priority Data

Mar. 6, 2007 (JP) ................................ 2007-056209
Feb. 12, 2008 (JP) ................................ 2008-030808

(51) Int. Cl.
*H01S 3/04* (2006.01)
*H01S 5/00* (2006.01)
(52) U.S. Cl. ................ 372/43.01; 372/50.124
(58) Field of Classification Search ............... 372/43.01, 372/50.124, 50.11
See application file for complete search history.

(56) References Cited

U.S. PATENT DOCUMENTS

| 4,813,051 | A  | * | 3/1989  | Taneya et al. ............ 372/50.12 |
| 6,319,742 | B1 |   | 11/2001 | Hayashi et al. |
| 6,972,204 | B2 | * | 12/2005 | Oohata et al. ................ 438/22 |
| 2001/0055325 | A1 | * | 12/2001 | Nemoto .......................... 372/50 |
| 2004/0115847 | A1 | * | 6/2004  | Hasegawa et al. ............. 438/22 |
| 2005/0175053 | A1 |   | 8/2005  | Kimura et al. |
| 2005/0232322 | A1 |   | 10/2005 | Bessho et al. |
| 2006/0109883 | A1 | * | 5/2006  | Lewis et al. ............... 372/50.12 |
| 2006/0118893 | A1 | * | 6/2006  | Behfar et al. ................. 257/414 |

FOREIGN PATENT DOCUMENTS

| JP | 11-142878 | 5/1999 |
| JP | 2003-060233 | 2/2003 |
| JP | 2005-209950 | 8/2005 |
| JP | 2005-317896 | 11/2005 |
| JP | 2006-237339 A | 9/2006 |

\* cited by examiner

*Primary Examiner* — Patrick Stafford
(74) *Attorney, Agent, or Firm* — Ditthavong Mori & Steiner, P.C.

(57) ABSTRACT

A semiconductor laser diode apparatus capable of suppressing difficulty in handling of the semiconductor laser diode also when the width of a semiconductor laser diode portion is small is obtained. This method of fabricating a semiconductor laser diode apparatus includes steps of forming a plurality of first semiconductor laser diode portions on a first substrate at a prescribed interval in a second direction intersecting with a first direction in which cavities extend, bonding one or some of the plurality of first semiconductor laser diode portions to a second substrate, separating the one or some of the plurality of first semiconductor laser diode portions bonded to the second substrate from the first substrate; and dividing the second substrate along the second direction.

11 Claims, 31 Drawing Sheets

METHOD OF FABRICATING SEMICONDUCTOR LASER DIODE APPARATUS AND SEMICONDUCTOR LASER DIODE APPARATUS

CROSS-REFERENCE TO RELATED APPLICATIONS

The priority application number JP2007-056209, Method of Fabricating Semiconductor Laser Diode Apparatus and Semiconductor Laser Diode Apparatus, Mar. 6, 2007, Masayuki Hata, JP2008-30808, Method of Fabricating Semiconductor Laser Diode Apparatus and Semiconductor Laser Diode Apparatus, Feb. 12, 2008, Masayuki Hata, upon which this patent application is based is hereby incorporated by reference.

BACKGROUND OF THE INVENTION

1. Field of the Invention

The present invention relates to a method of fabricating a semiconductor laser diode and a semiconductor laser diode, and more particularly, it relates to a method of fabricating a semiconductor laser diode formed with a semiconductor laser diode portion on a substrate and a semiconductor laser diode formed with a semiconductor laser diode portion on a substrate.

2. Description of the Background Art

A method of fabricating a semiconductor laser diode formed with a semiconductor laser diode portion on a substrate is known in general, as disclosed in Japanese Patent Laying-Open No. 2005-209950, for example.

The aforementioned Japanese Patent Laying-Open No. 2005-209950 discloses a method of fabricating a semiconductor laser diode, comprising steps of forming a plurality of first laser oscillation portions on a semiconductor substrate at a prescribed interval, forming a plurality of second laser oscillation portions (semiconductor laser diode portions) on a sapphire substrate at a prescribed interval, bonding all of the second laser oscillation portions on the sapphire substrate to the first laser oscillation portions on the semiconductor substrate respectively and dividing the semiconductor substrate for the respective second laser oscillation portions.

In the method of fabricating a semiconductor laser diode disclosed in Japanese Patent Laying-Open No. 2005-209950, however, the semiconductor substrate is divided for the respective second laser oscillation portions after all the second laser oscillation portions formed on the sapphire substrate at the prescribed interval are bonded to the first laser oscillation portions on the semiconductor substrate respectively, and hence the width of the divided semiconductor substrate is reduced when the width of each second laser oscillation portion (semiconductor laser diode portion) formed on the sapphire substrate is reduced in order to increase the number of the second laser oscillation portions per sapphire substrate. Thus, the width of each semiconductor laser diode is reduced and hence handling of the semiconductor laser diode is disadvantageously difficult.

SUMMARY OF THE INVENTION

A method of fabricating a semiconductor laser diode apparatus according to a first aspect of the present invention comprises steps of forming a plurality of first semiconductor laser diode portions on a first substrate at a prescribed interval in a second direction intersecting with a first direction in which cavities extend, bonding one or some of the plurality of first semiconductor laser diode portions to a second substrate, separating the one or some of the plurality of first semiconductor laser diode portions bonded to the second substrate from the first substrate, and dividing the second substrate along the second direction.

A semiconductor laser diode apparatus according to a second aspect of the present invention comprises a substrate, a first semiconductor laser diode portion having a cavity, formed on a surface of the substrate, and an electrode layer electrically connected to a surface farther from the substrate of the first semiconductor laser diode portion and formed so as to extend on the surface of the substrate adjacent to the first semiconductor laser diode portion, wherein a length of the substrate in a second direction intersecting with a first direction in which the cavity extends is larger than a length in the second direction of the first semiconductor laser diode portion.

A semiconductor laser diode apparatus according to a third aspect of the present invention comprises a substrate, a first semiconductor laser diode portion having a cavity, formed on a surface of the substrate, and an electrode layer formed on a surface farther from the substrate of the first semiconductor laser diode portion, wherein a length of the substrate in a second direction intersecting with a first direction in which the cavity extends is larger than a length in the second direction of the first semiconductor laser diode portion, and the first semiconductor laser diode portion has a protruding portion protruding in the second direction.

A semiconductor laser diode apparatus according to a fourth aspect of the present invention comprises a substrate, a plurality of semiconductor laser diode portions each having a cavity, formed on a surface of the substrate, and an electrode layer electrically connected to a surface farther from the substrate of each of the plurality of semiconductor laser diode portions and formed so as to extend on the surface of the substrate adjacent to each of the plurality of semiconductor laser diode portions wherein the plurality of semiconductor laser diode portions are formed at a prescribed interval in a second direction intersecting with a first direction in which each of the cavity extends, and the prescribed interval is larger than a length in the second direction of each of the plurality of semiconductor laser diode portions.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be hereinafter described with reference to the drawings.

A schematic structure of a semiconductor laser diode of the present invention and a process of fabricating the same will be described with reference to FIGS. 1 to 12 before describing specific embodiments of the present invention.

The schematic structure of the semiconductor laser diode of the present invention will be described with reference to FIGS. 1 and 2.

Figure 2:
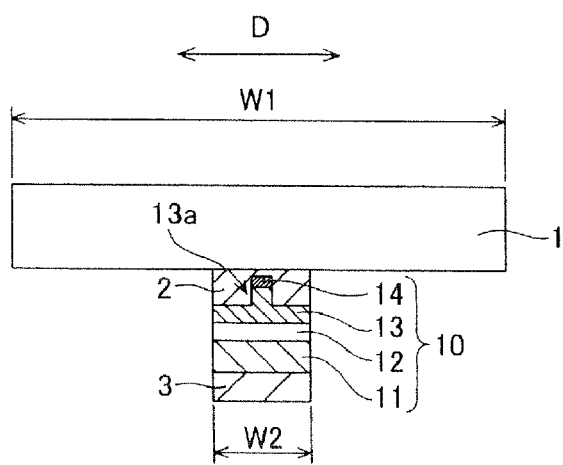
FIG. 2 is a sectional view taken along the line 1000-1000 in FIG. 1.

In the semiconductor laser diode of the present invention, a semiconductor laser diode portion 10 is fixed on a surface (lower surface) of a support substrate 1 through a conductive adhesive layer 2, as shown in FIG. 2. The support substrate 1 is an example of the "second substrate" and the "substrate" in the present invention. The semiconductor laser diode portion 10 is an example of the "first semiconductor laser diode portion" in the present invention. An electrode 3 is formed on a side farther from the support substrate 1 of the semiconductor laser diode portion 10 (lower surface side).

Figure 1:
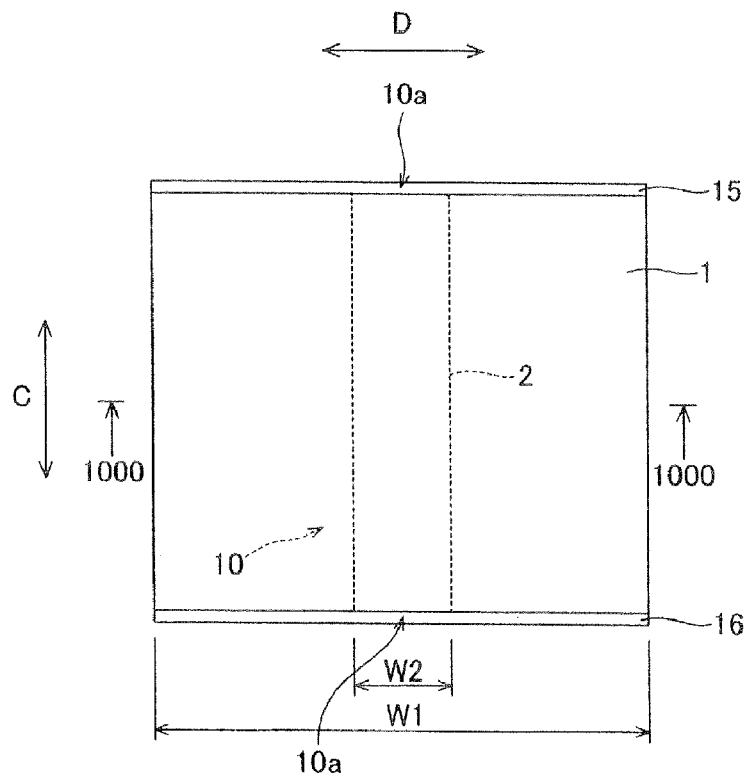
FIG. 1 is a plan view for schematically illustrating a structure of a semiconductor laser diode of the present invention.

In the semiconductor laser diode of the present invention, the semiconductor laser diode portion 10 is so formed as to extend in a direction C and a width (length) W1 in a direction D perpendicular to the direction C of the support substrate 1 is larger than a width (length) W2 in the direction D of the semiconductor laser diode portion 10, as shown in FIG. 1. The semiconductor laser diode portion 10 may be formed on the center in the direction D of the support substrate 1, or may be formed on an end in the direction D of the support substrate 1.

A semiconductor layer constituted by successively forming a first semiconductor layer 11, an active layer 12 made of semiconductor, and a second semiconductor layer 13 from a lower side is formed in the semiconductor laser diode portion 10 as shown in FIG. 2. An electrode 14 is formed on the second semiconductor layer 13. A waveguide structure extending in the direction C (see FIG. 1) is formed in the semiconductor layer. For example, the waveguide structure is formed in the second semiconductor layer 13 by forming a ridge portion 13a extending in the direction C. A method of forming the waveguide structure is not restricted to a method of forming the ridge portion 13a, but the waveguide structure may be formed by another structure such as a buried heterostructure.

As shown in FIG. 1, a pair of cavity planes 10a are formed on ends in the direction C of the semiconductor layer of the semiconductor laser diode portion 10. The pair of cavity planes 10a and the waveguide structure constitutes a cavity extending in the direction C. In a case where the semiconductor layer has cleavability, the ridge portion 13a is preferably formed so as to extend in a direction perpendicular to a cleavage plane of the semiconductor layer such that the cavity planes 10a can be formed by cleavage. The cavity planes 10a may be formed by dry etching. The dielectric multilayer films 15 and 16 are formed on the cavity planes 10a as necessary. The thicknesses and the refractive indices of the dielectric multilayer films 15 and 16 are designed such that the refractive indices are low on a laser emission side and high on a reflection side.

A conductive substrate or an insulating substrate may be employed as the support substrate 1. A metal plate such as Cu—W, Al and Fe—Ni or a semiconductor substrate such as single-crystalline Si, SiC, GaAs and ZnO or a polycrystalline AlN substrate may be employed as the conductive substrate, for example. Alternately, a conductive resin film in which conductive grains of a metal or the like are dispersed, a composite material of a metal and a metal oxide may be employed, or a composite material of carbon and a metal made of a sintered metallic material may be employed. In a case of employing the conductive substrate, an electrode may be formed on a surface farther from the semiconductor layer to be bonded (upper surface). A semiconductor substrate may be employed as the support substrate 1. A substrate formed with a semiconductor laser diode may be employed as the semiconductor substrate. In this case, it is possible to prepare an integrated laser diode. A GaAs substrate formed with a GaInAs-based, AlGaAs-based or AlGaInP-based semiconductor laser diode can be employed as the substrate formed with the semiconductor laser diode. A nitride-based semiconductor laser diode or the like may be bonded onto this GaAs substrate.

The first semiconductor layer 11 is formed by a cladding layer or the like having a band gap larger than that of the active layer 12. The first semiconductor layer 11 has a light guide layer having a band gap between the first semiconductor layer 11 and the active layer 12 on a side closer to the active layer 12 of the first semiconductor layer 11.

The active layer 12 is formed by a single layer, a single quantum well (SQW) structure or a multiple quantum well (MQW) structure.

The second semiconductor layer 13 is formed by a cladding layer or the like having a band gap larger than that of the active layer 12. The second semiconductor layer 13 has a light guide layer having a band gap between the second semiconductor layer 13 and the active layer 12 on a side closer to the active layer 12 of the second semiconductor layer 13. The second semiconductor layer 13 may have a contact layer on a side farther from the active layer 12 of the second semiconductor layer 13 (upper surface side). In this case, the contact layer preferably has a band gap smaller than that of the cladding layer.

The semiconductor layer (the first semiconductor layer 11, the active layer 12 and the second semiconductor layer 13) is made of an AlGaAs-based material, a GaInAs-based material, an AlGaInP-based material, an AlGaInNAs-based material, an AlGaSb-based material, a GaInAsP-based material, nitride-based semiconductor, a MgZnSSe-based material, a ZnO-based or the like. GaN, AlN, InN, BN, TlN or a mixed crystal thereof can be employed as the nitride-based semiconductor.

A layer made of solder or conductive paste can be employed as the adhesive layer 2. The solder made of AuSn, InSn, SnAgCu, SnAgBi, SnAgCuBi, SnAgBiIn, SnZn, SnCu, SnBi, SnZnBi or the like can be employed.

A schematic process of fabricating the semiconductor laser diode of the present invention will be now described with reference to FIGS. 1 to 12.

Figure 3:
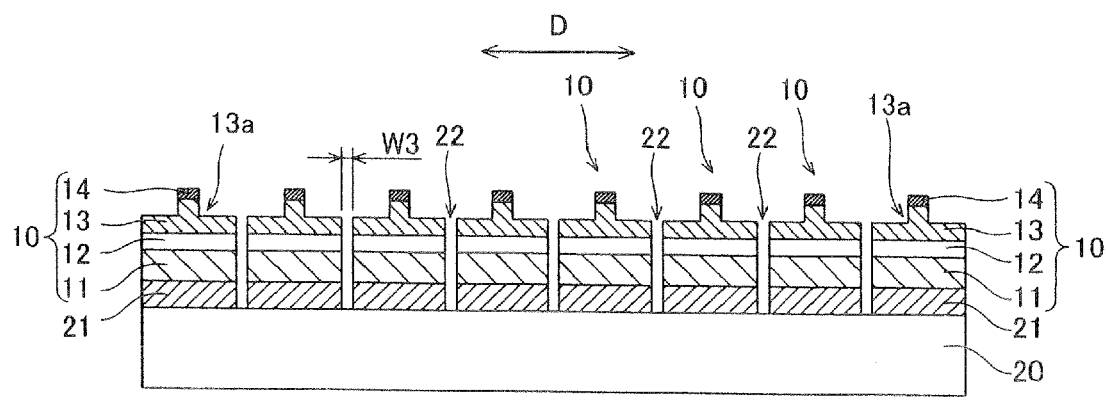
FIG. 3 is a sectional view for schematically illustrating a process of fabricating the semiconductor laser diode shown in FIG. 1.

As shown in FIG. 3, a separative layer 21 is formed on au upper surface of a growth substrate 20 and thereafter the first semiconductor layer 11, the active layer 12 made of the semiconductor layer and the second semiconductor layer 13 are successively grown. At this time, a buffer layer may be formed between the growth substrate 20 and the first semiconductor layer 11. The growth substrate 20 is an example of the "first substrate" in the present invention.

The separative layer 21 is formed by a layer easily removed or a layer easily mechanically separated as compared with the semiconductor layer (the first semiconductor layer 11, the active layer 12 and the second semiconductor layer 13). The layer easily removed includes layers made of a material having a melting point or a boiling point lower than that of the semiconductor layer, a material easily decomposed as compared with the semiconductor layer, a material easily dissolved as compared with the semiconductor layer, a material easily reacting as compared with the semiconductor layer and the like, for example.

In a case where the semiconductor layer (the first semiconductor layer 11, the active layer 12 and the second semiconductor layer 13) is formed by a nitride-based semiconductor having a wurtzite structure, a nitride-based semiconductor substrate or a α-SiC, GaAs, GaP, InP, Si, sapphire, spinel, or LiAlO$_3$ substrate having a hexagonal structure or a rhombohedral structure can be employed as the growth substrate 20. The nitride-based semiconductor layer having the most excellent crystallinity can be obtained by employing the nitride-based semiconductor substrate. In a case where the nitride-based semiconductor substrate, the SiC substrate or the sapphire substrate is employed, a (H, K, —H—K, 0) plane (at least either H or K is nonzero) such as a {11-20} plane and a {1-100} plane, a (0001) plane, a (11-22) plane, a (1-101) plane, or a (1-103) plane is employed as the plane direction of the substrate. In a case where the GaAs substrate, the GaP substrate, the InP substrate or the Si substrate is employed, a {111} plane or the like is employed. In a case where the semiconductor layer is made of AlGaAs-based, GaInAs-based, AlGaInP-based or AlGaInNAs-based semiconductor, the GaAs substrate or the Si substrate can be employed and a {001} plane, a {110} plane, the {111} plane, or a {−1−1−1} plane is employed as the plane direction thereof. In a case where the semiconductor layer is made of GaInAsP-based semiconductor, the GaAs substrate or the InP substrate can be employed and the {001} plane, the {110} plane, the {111} plane or the {−1−1−1} plane are employed as the plane direction thereof.

Figure 4:
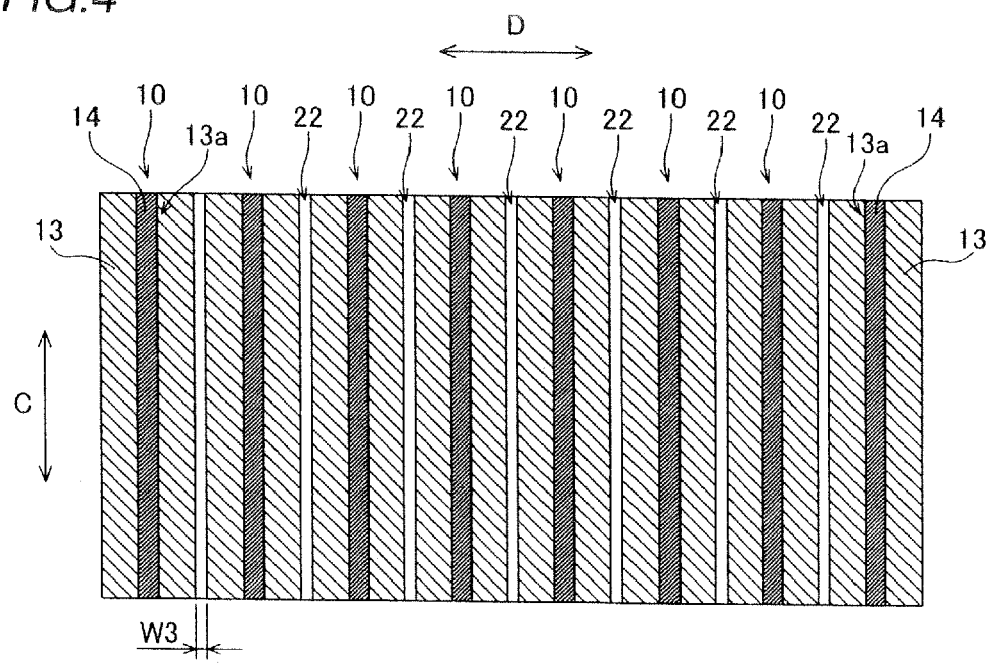
FIG. 4 is a plan view for schematically illustrating a process of fabricating the semiconductor laser diode shown in FIG. 1.

Thereafter the second semiconductor layer 13 of the semiconductor layer is formed with the ridge portions 13a formed with the electrodes 14 on the upper surfaces, for example. Then isolation grooves 22 each having a width W3 are formed so that a plurality of the semiconductor laser diode portions 10 are formed at prescribed intervals (W3) in the direction D intersecting with a direction in which the cavities extend. At this time, the isolation grooves 22 are formed so as not to intersect with the waveguide structures as shown in FIG. 4. The isolation grooves 22 are so formed as to extend substantially parallel to the direction C in which the ridge portions 13a extend, for example.

Figure 5:
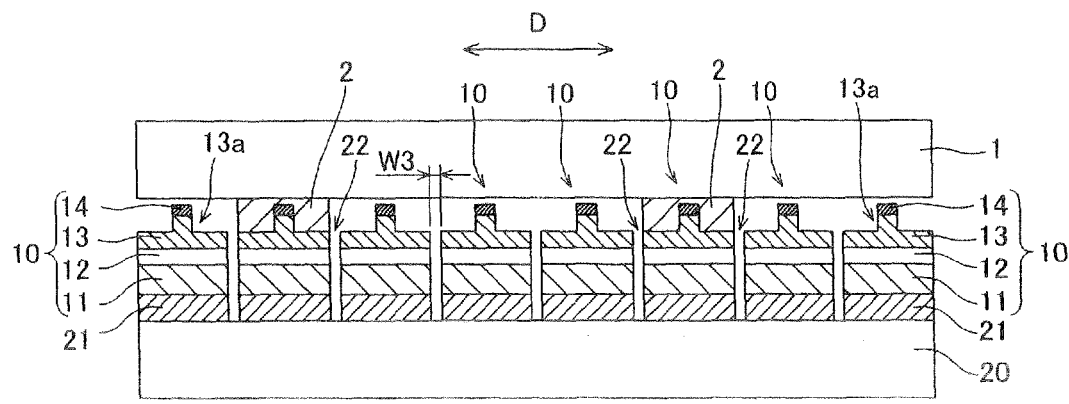
FIG. 5 is a sectional view for schematically illustrating a process of fabricating the semiconductor laser diode shown in FIG. 1.
Figure 6:
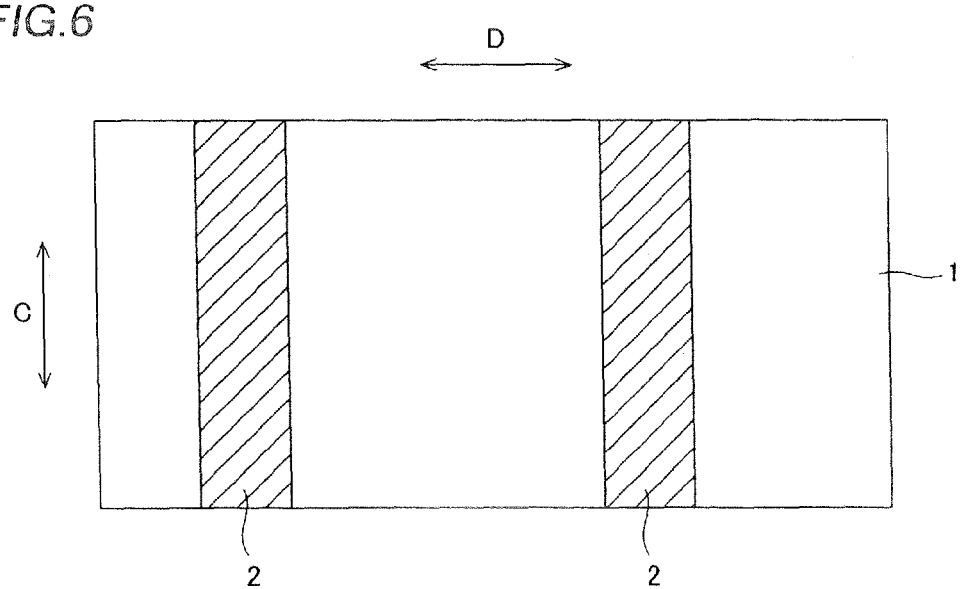
FIG. 6 is a bottom plan view for schematically illustrating a process of fabricating the semiconductor laser diode shown in FIG. 1.

Thereafter the semiconductor laser diode portions 10 are bonded to the support substrate 1 through a plurality of the adhesive layers 2 provided to extend in the direction C (see FIG. 6), as shown in FIG. 5. At this time, some of the plurality of semiconductor laser diode portions 10 isolated with the isolation grooves 22 are selectively bonded to the support substrate 1. FIG. 5 shows a case where every four semiconductor laser diode portions 10 among the plurality of semiconductor laser diode portions 10 are bonded to the support substrate 1, for example. In this step, a plurality of projecting portions may be formed on the support substrate 1 and the semiconductor laser diode portions 10 may be bonded to the projecting portions.

Figure 7:
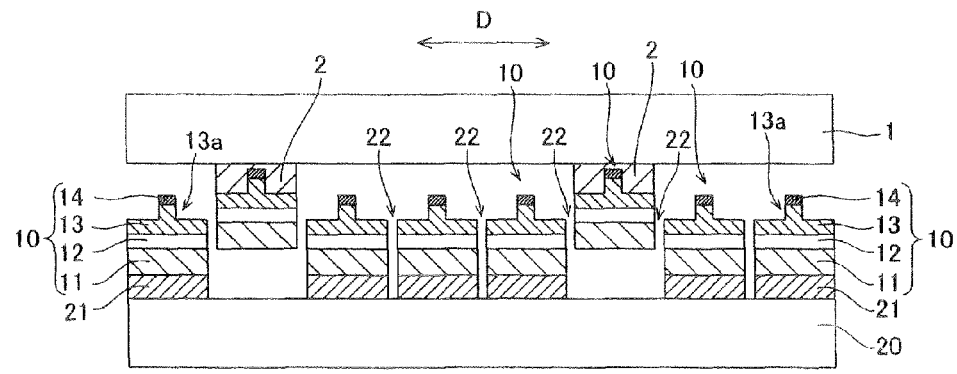
FIGS. 7 to 9 are sectional views for schematically illustrating a process of fabricating the semiconductor laser diode shown in FIG. 1.

As shown in FIG. 7, only the semiconductor laser diode portions 10 bonded to the support substrate 1 among the plurality of semiconductor laser diode portions 10 isolated with the isolation grooves 22 are selectively separated from the growth substrate 20. At this time, only the separative layers 21 in contact with the semiconductor laser diode portions 10, to be separated are irradiated with a laser, and only the separative layers 21 irradiated with the laser may be evaporated, for example. In FIG. 7, the isolation grooves 22 are so formed as to completely isolate the semiconductor laser diode portions 10. The present invention is not restricted to this, but the isolation grooves 22 may be formed so as not to completely isolate the semiconductor laser diode portions 10 with the isolation grooves 22 so far as the isolation grooves 22 each have such a depth as to separate the semiconductor laser diode portions 10 bonded to the support substrate 1 and not to separate the adjacent semiconductor laser diode portions 10 in a step of this separation.

Figure 8:
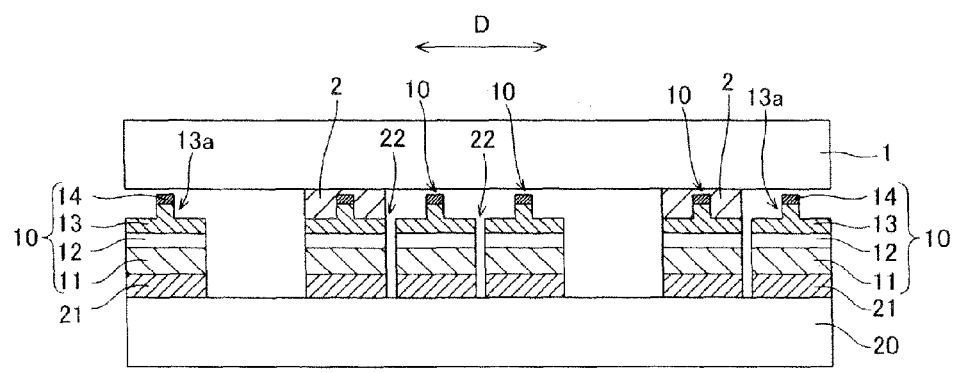

Thereafter steps from a step of bonding some of the semiconductor laser diode portions 10 to the support substrate 1 to a step of separating the some of the semiconductor laser diode portions 10 from the growth substrate 20 are repeated. In other words, adhesive layers 2 of another support substrate 1 are positioned so as to coincide with the semiconductor laser diode portions 10 remaining on the growth substrate 20 for bonding, as shown in FIG. 8. Then only the semiconductor laser diode portions 10 bonded to the support substrate 1 among the plurality of semiconductor laser diode portions 10 isolated with the isolation grooves 22 are selectively separated from the growth substrate 20.

Figure 9:
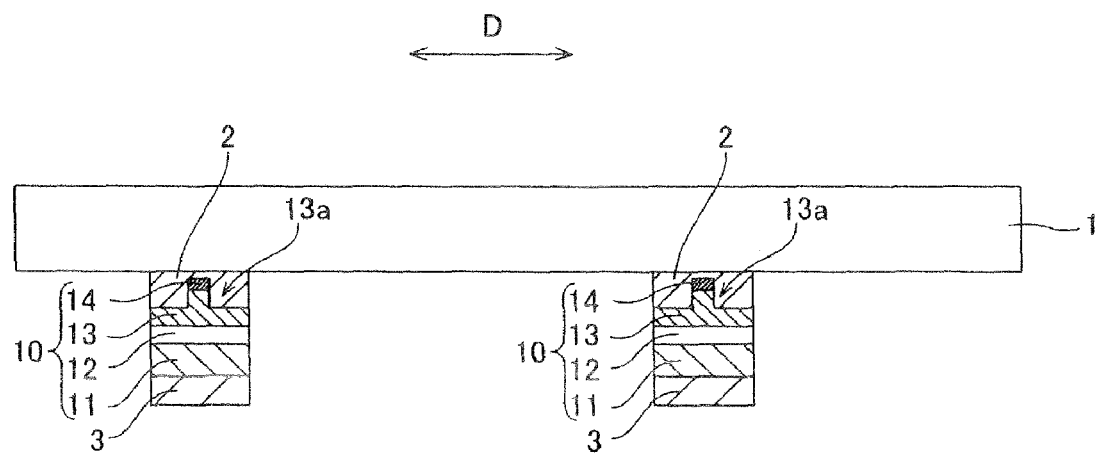

As shown in FIG. 9, the electrodes 3 are formed on a lower surface of the first semiconductor layer 11 of the semiconductor laser diode portion 10 bonded to the support substrate 1.

Figure 10:
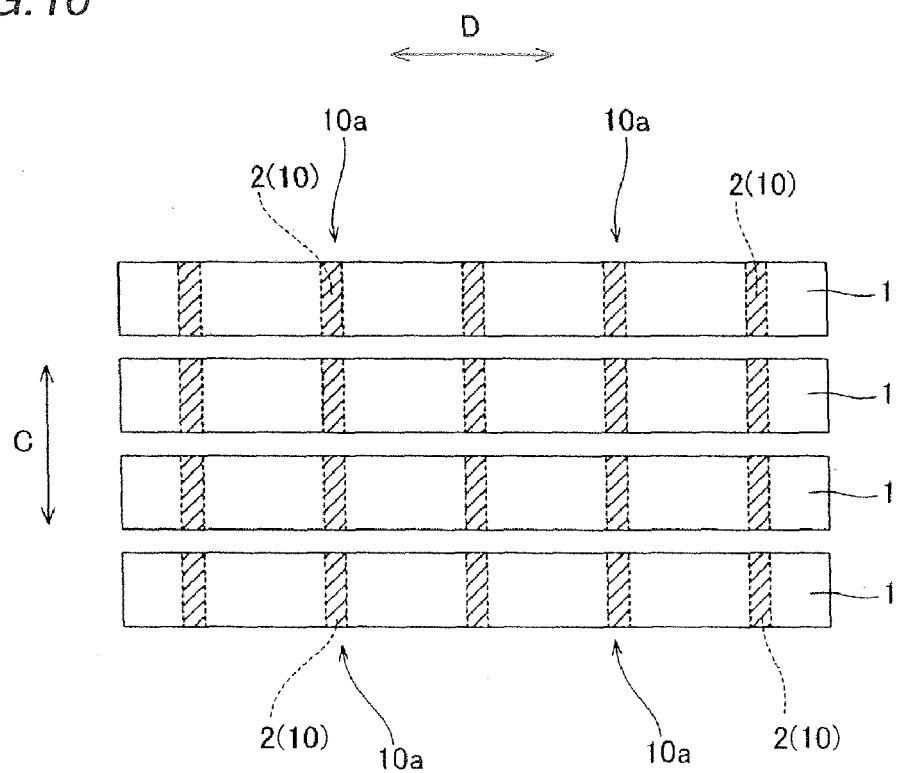
FIGS. 10 to 12 are plan views for schematically illustrating a process of fabricating the semiconductor laser diode shown in FIG. 1.

As shown in FIG. 10, the support substrate 1 to which the semiconductor laser diode portions 10 are bonded is divided (cleaved) along a surface substantially perpendicular to the direction C in which waveguide structures extend together with the semiconductor layers. Thus, a pair of the cavity planes 10a are formed on the ends of each semiconductor layer.

Figure 11:
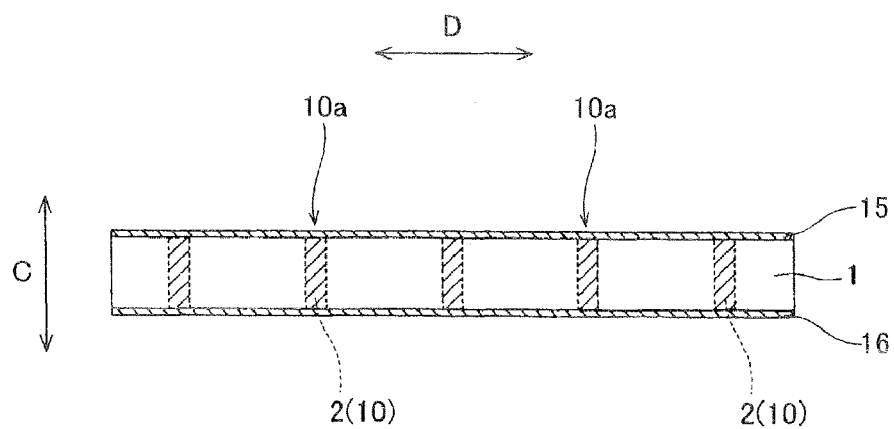

Thereafter the dielectric multilayer films 15 and 16 are formed on the cavity planes 10a as necessary, as shown in FIG. 11.

Figure 12:
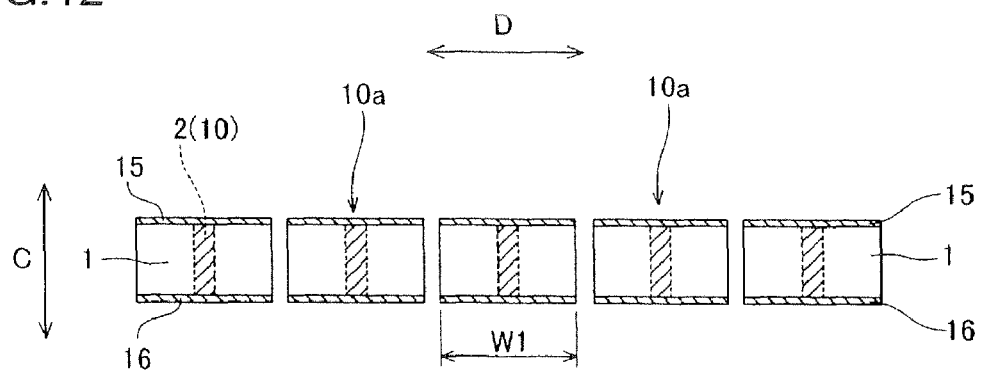

Finally, the support substrate 1 is divided such that each width (length) in the direction D is W1, thereby obtaining individual semiconductor laser diode, as shown in FIG. 12.

While a case where the every four semiconductor laser diode portions 10 are bonded to the support substrate 1 is shown in the schematic fabricating process and hence the W1 is substantially four times the W2, the schematic structure and fabricating process of the semiconductor laser diode are not restricted to the case where the every four semiconductor laser diode portions 10 are bonded to the support substrate. In other words, when every n (n≧2) semiconductor laser diode portions 10 are bonded to the support substrate 1, the W1 is n times the W2 and hence the W1 is at least twice the W2. Therefore, reduction in the semiconductor laser diode including the semiconductor laser diode portion 10 and the substrate 1 can be suppressed.

First Embodiment

A structure of a semiconductor laser diode according to a first embodiment will be now described with reference to FIGS. 13 to 15.

Figure 13:
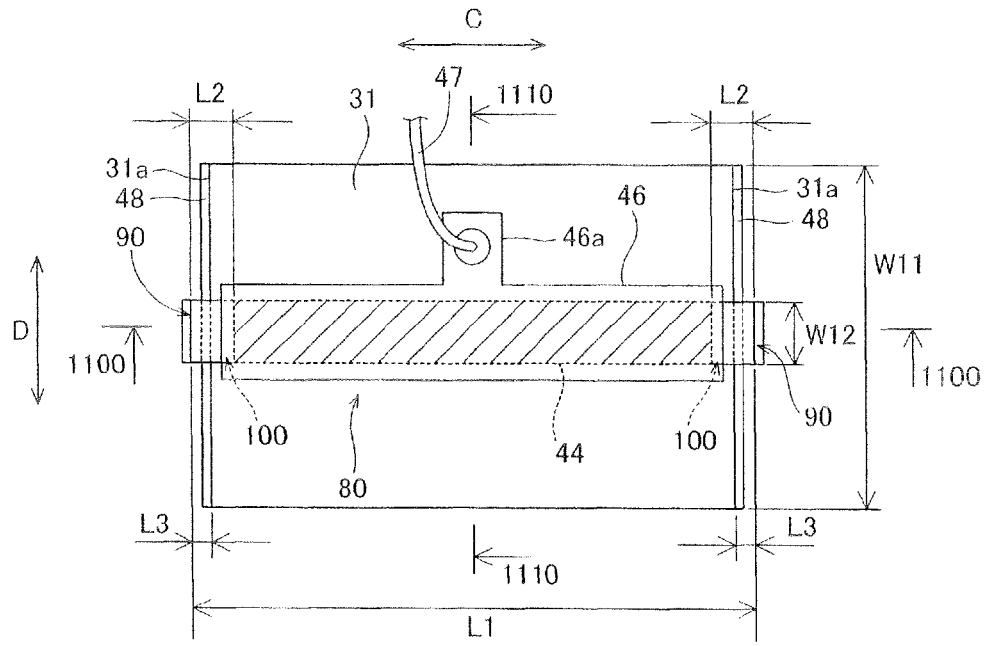
FIG. 13 is a bottom plan view of the semiconductor laser diode according to the first embodiment of the present invention.
Figure 14:
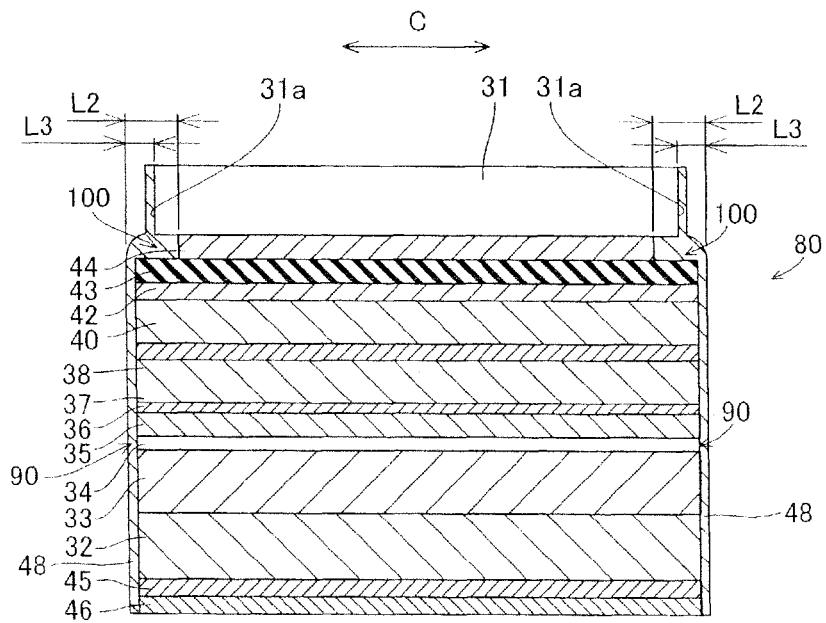
FIG. 14 is a sectional view taken along the line 1100-1100 in FIG. 13.

In the semiconductor laser diode according to the first embodiment, a conductive support substrate 31 made of Cu—W having no cleavability and a semiconductor laser diode portion 80 are bonded to each other through a conductive adhesive layer 44 made of AuSn, as shown in FIGS. 13 and 14. The support substrate 31 is an example of the "second substrate" and the "substrate" in the present invention, and the semiconductor laser diode portion 80 is an example of the "first semiconductor laser diode portion" in the present invention. A pair of cavity planes 90 formed by cleavage planes are formed on ends in a direction C of the semiconductor laser diode portion 80.

According to the first embodiment, a length (cavity length) L1 in the direction C of the semiconductor laser diode (support substrate 31) is about 600 μm and a width (length) W11 in a direction D is about 400 μm, as shown in FIG. 13. A width (length) W12 in the direction D of the semiconductor laser diode portion 80 is about 40 μm. In other words, according to the first embodiment, the width (length) W11 in the direction D of the support substrate 31 is about 10 times the width (length) W12 in the direction D of the semiconductor laser diode portion 80.

As shown in FIG. 14, regions 100 where no adhesive layer 44 is provided are formed in the vicinity of the ends closer to the support substrate 31 of the cavity planes 90 of the semiconductor laser diode portion 80. Each of these regions 100 where no adhesive layer 44 is provided is formed up to a region spaced at an distance (L2) of about 25 μm inside with respect to an extension of the cavity plane 90, as shown in FIG. 13. Side end surfaces 31a in the direction C of the support substrate 31 are each formed parallel to the cavity plane 90 at a position deviated inside with respect to the extension of the cavity plane 90 by a length (L3) of about 20 μm by dicing at the time of device division described later.

Figure 15:
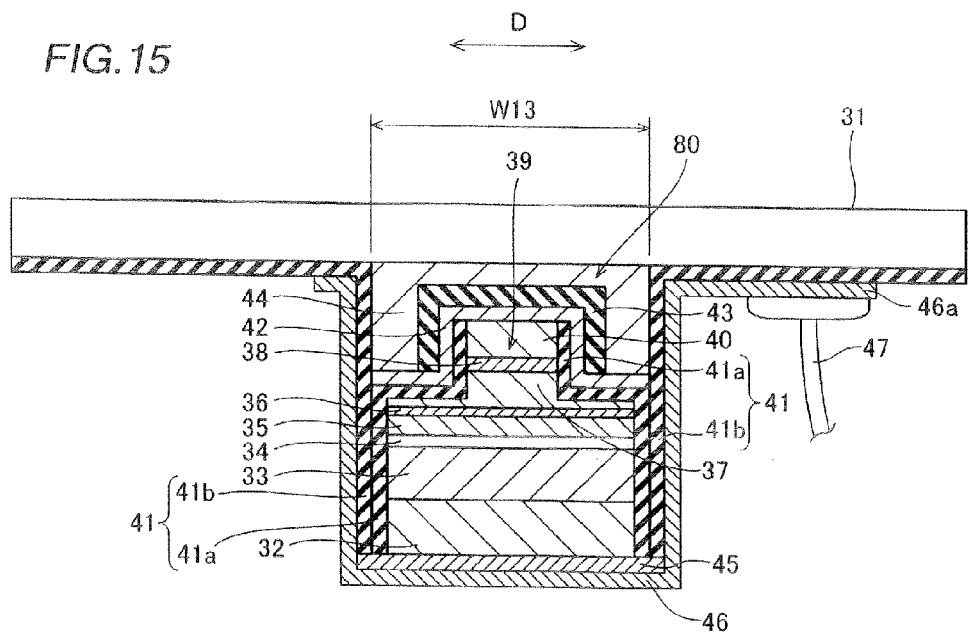
FIG. 15 is a sectional view taken along the line 1110-1110 in FIG. 13.

As shown in FIGS. 14 and 15, an n-type cladding layer 33 made of $Al_{0.07}Ga_{0.93}N$ having a carrier concentration of about $5 \times 10^{18}$ cm$^{-3}$ doped with Si of about $5 \times 10^{18}$ cm$^{-3}$ having a thickness of about 400 nm is formed on an n-type contact layer 32 made of GaN having a carrier concentration of about $5 \times 10^{18}$ cm$^{-3}$ doped with Si of about $5 \times 10^{18}$ cm$^{-1}$, having a thickness of about 5 μm. A light-emitting layer 34 is formed on the n-type cladding layer 33.

This light-emitting layer 34 is formed with an n-type carrier blocking layer (not shown) made of $Al_{0.16}Ga_{0.84}N$ having a carrier concentration of about $5 \times 10^{18}$ cm$^{-3}$ doped with Si of about 5×10$^{18}$ cm$^{-3}$, having a thickness of about 5 nm on the n-type cladding layer 33. An n-type light guide layer (not shown) made of GaN doped with Si, having a thickness of about 100 nm is formed on the n-type carrier blocking layer. An MQW active layer (not shown) obtained by alternately stacking four barrier layers made of undoped In$_{0.02}$Ga$_{0.98}$N each having a thickness of about 20 nm and three quantum well layers made of undoped In$_{0.15}$Ga$_{0.85}$N each having a thickness of about 3 nm is formed on the n-type light guide layer. Thus the n-type carrier blocking layer, the n-type light guide layer and the MQW active layer constitute the light-emitting layer 34.

A p-type light guide layer 35 made of GaN doped with Mg of about 4×10$^{19}$ cm$^{-3}$, having a thickness of about 100 nm is formed on the light-emitting layer 34, as shown in FIG. 15. A p-type cap layer 36 made of Al$_{0.16}$Ga$_{0.84}$N doped with Mg of about 4×10$^{19}$ cm$^{-3}$, having a thickness of about 20 nm is formed on the p-type light guide layer 35. A p-type cladding layer 37 made of Al$_{0.07}$Ga$_{0.93}$N having a carrier concentration of about 5×10$^{17}$ cm$^{-3}$ doped with Mg of about 4×10$^{19}$ cm$^{-3}$, having a projecting portion is formed on the p-type cap layer 36. The thickness of the projecting portion of the p-type cladding layer 37 is about 400 nm, and the thickness of each of the planar portions other than the projecting portion of the p-type cladding layer 37 is about 80 nm. A p-type contact layer 38 made of In$_{0.02}$Ga$_{0.98}$N having a carrier concentration of about 5×10$^{17}$ cm$^{-3}$ doped with Mg of about 4×10$^{19}$ cm$^{-3}$, having a thickness of about 10 nm is formed on an upper surface of the projecting portion of the p-type cladding layer 37. The projecting portion of the p-type cladding layer 37 and the p-type contact layer 38 constitute a ridge portion 39 employed as a current path. This ridge portion 39 has a width of about 1.5 µm and a height of about 380 nm. A p-side ohmic electrode 40 constituted by forming a Pt layer having a thickness of about 5 nm, a Pd layer having a thickness of about 100 nm and an Au layer having a thickness of about 150 nm in ascending order is formed on the p-type contact layer 38.

Inner portions 41a of an insulating film 41 made of SiO$_2$ having a thickness of about 250 nm are formed on side surfaces of the n-type contact layer 32, the n-type cladding layer 33, the light-emitting layer 34, the p-type light guide layer 35, the p-type cap layer 36, the ridge portion 39 and the p-side ohmic electrode 40. Outer portions 41b of the insulating film 41 are formed on side surfaces of the inner portions 41a of the insulating film 41 and the adhesive layer 44 and a lower surface of the support substrate 31. A p-side pad electrode 42 constituted by forming a Ti layer having a thickness of about 100 nm, a Pd layer having a thickness of about 100 nm and an Au layer having a thickness of about 3000 nm in ascending order is formed on upper surfaces of the inner portions 41a of the insulating film 41 and an upper surface of the p-side ohmic electrode 40 with a width W13 of about 45 µm. An insulating film 43 made of SiO$_2$ having a thickness of about 100 nm is formed on the p-side pad electrode 42. This insulating film 43 has a function of suppressing reaction between the adhesive layer 44 and the p-side ohmic electrode 40. Thus, the semiconductor laser diode portion 80 is formed and the semiconductor laser diode portion 80 and the support substrate 31 are bonded to each other through the adhesive layer 44.

An n-side ohmic electrode 45 and an n-side pad electrode 46 are successively formed on a side of a back surface (lower surface) of the n-type contact layer 32 from a side of the n-type contact layer 32 (upper side). The n-side pad electrode 46 is an example of the "electrode layer" in the present invention.

According to the first embodiment, the n-side pad electrode 46 is electrically connected to a surface farther from the support substrate 31 of the semiconductor laser diode portion 80 (lower surface), and is formed so as to extend on a surface of the support substrate 31 adjacent to the semiconductor laser diode portion 80 (lower surface). As shown in FIG. 13, a protruding portion 46a protruding toward a first side in the direction D is formed on the center in the direction C of the n-side pad electrode 46 and a metal wire 47 is wire-bonded onto a surface of the protruding portion 46a.

As shown in FIGS. 13 and 14, dielectric multilayer films 48 are formed so as to extend from the cleavage planes (cavity planes 90) of the semiconductor laser diode portion 80 to the side end surfaces 31a of the support substrate 31. As shown in FIGS. 13 to 15, the waveguide structure extending in the direction C formed by forming a lower portion of the ridge portion 39 and the cavity planes 90 constitute a cavity extending in the direction C.

A process of fabricating the semiconductor laser diode according to the first embodiment will be now described with reference to FIGS. 13 to 23. FIGS. 16 to 19 and 21 are sectional views taken in the same direction as FIG. 15, while FIG. 20 is a sectional view taken in the same direction as FIG. 14.

Figure 16:
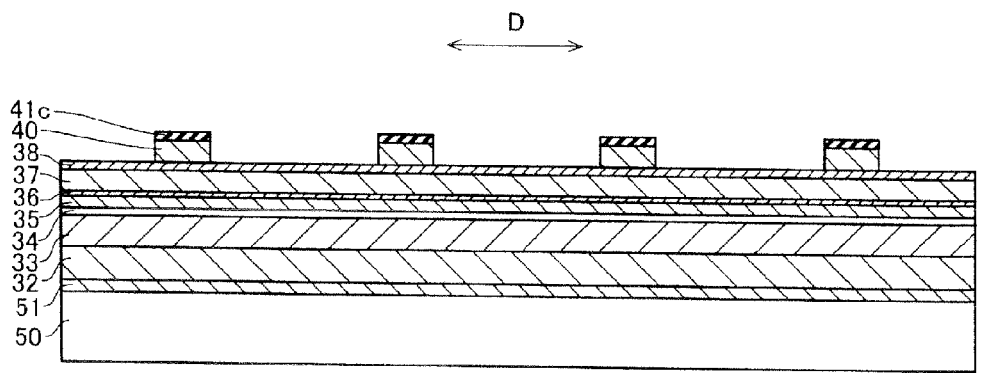
FIGS. 16 to 21 are sectional views for illustrating a process of fabricating the semiconductor laser diode according to the first embodiment shown in FIG. 13.

As shown in FIG. 16, a separative layer 51 made of In$_{0.35}$Ga$_{0.65}$N having a thickness of about 20 nm is grown on a (0001) Ga plane of a GaN substrate 50 employed as a growth substrate by metal organic vapor phase epitaxy (MOVPE) while holding the GaN substrate 50 at a growth temperature of about 600° C. The separative layer 51 is made of a material having a band gap smaller than the MQW active layer of the light-emitting layer 34. More specifically, according to the first embodiment, the separative layer 51 is made of InGaN having an In composition higher than that of InGaN of the MQW active layer of the light-emitting layer 34. The GaN substrate 50 is an example of the "first substrate" in the present invention.

The n-type contact layer 32 and the n-type cladding layer 33 are successively grown on the separative layer 51 by MOVPE while holding at a growth temperature of about 1100° C. The light-emitting layer 34, the p-type light guide layer 35 and the p-type cap layer 36 are successively grown on the n-type cladding layer 33 while holding the GaN substrate 50 at a growth temperature of about 800° C. The p-type cladding layer 37 having a thickness of about 400 nm is grown on the p-type cap layer 36 while holding the GaN substrate 50 at a growth temperature of about 1100° C. Then the p-type contact layer 38 is grown on the p-type cladding layer 37 while holding the GaN substrate 50 at a growth temperature of about 800° C. Thereafter the GaN substrate 50 is annealed in an N$_2$ atmosphere while holding the same at a growth temperature of about 800° C. so that acceptor of the p-type nitride-based semiconductor layer is activated, thereby obtaining a prescribed concentration of holes.

The p-side ohmic electrode 40 and an insulating film 41c made of SiO$_2$ having a thickness of about 0.25 µm are successively formed on a surface of the p-type contact layer 38 by vacuum evaporation or the like and thereafter patterned, thereby obtaining the p-side ohmic electrodes 40 and the insulating films 41c having shapes as shown in FIG. 16.

Figure 17:
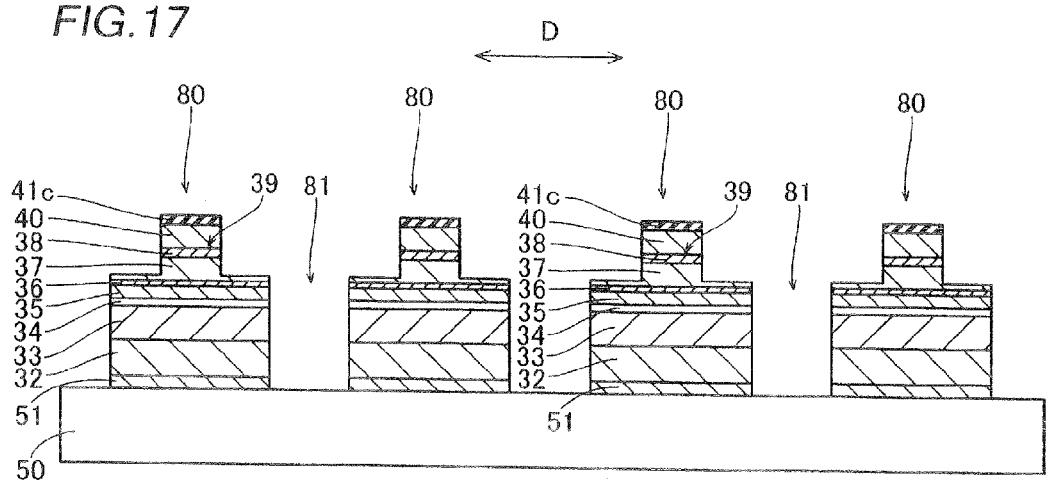

As shown in FIG. 17, the insulating films 41c are employed as masks for dry-etching with Cl$_2$ gas while holding the GaN substrate 50 at a temperature of about 200° C. so that the p-type contact layer 38 and the p-type cladding layer 37 are partially removed, thereby forming the ridge portions 39 in a period of about 50 µm. Then isolation grooves 81 are formed by partially etching from the separative layer 51 to the planar portions of the p-type cladding layer 37 by photolithography and dry-etching with a width of about 10 µm, and the layers from the separative layers 51 to the p-type cladding layers 37 are patterned to each have a width of about 40 μm.

Figure 18:
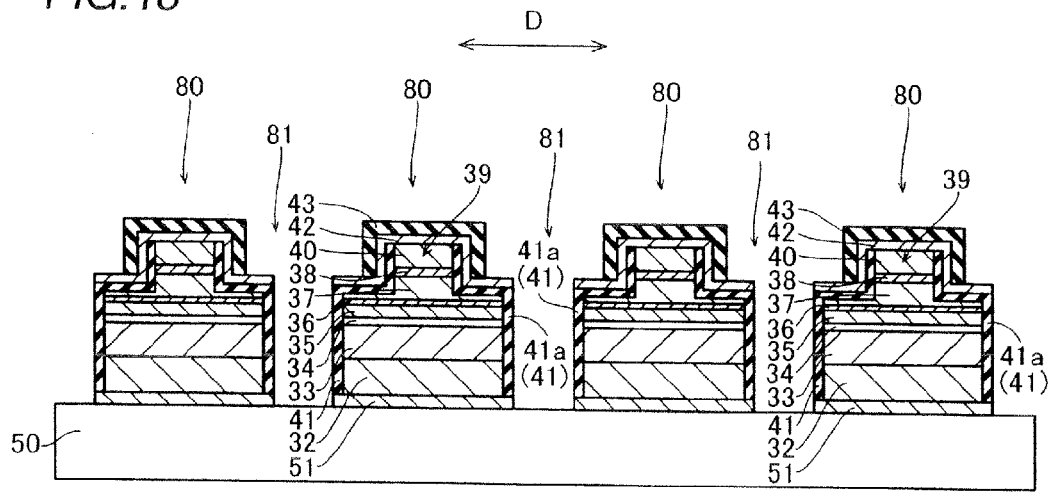

The insulating films 41 made of $SiO_2$ each having a thickness of about 250 nm are so formed as to cover the side surfaces of from the n-type contact layers 32 to the planar portions of the p-type cladding layers 37, the upper surfaces of the planar portions of the p-type cladding layers 37, the side surfaces of the ridge portion 39 and the upper surfaces of the insulating films 41c (see FIG. 17) as shown in FIG. 18 and thereafter only the insulating films 41 and 41c on the p-side ohmic electrodes 40 are removed.

The p-side pad electrodes 42 are formed on the p-side ohmic electrodes 40 and the insulating films 41. Then the insulating films 43 made of $SiO_2$ each having a thickness of about 100 nm are formed on the p-side pad electrodes 42. Thus, the plurality of semiconductor laser diode portions 80 are formed on the GaN substrate 50 at prescribed intervals in the direction D.

Figure 19:
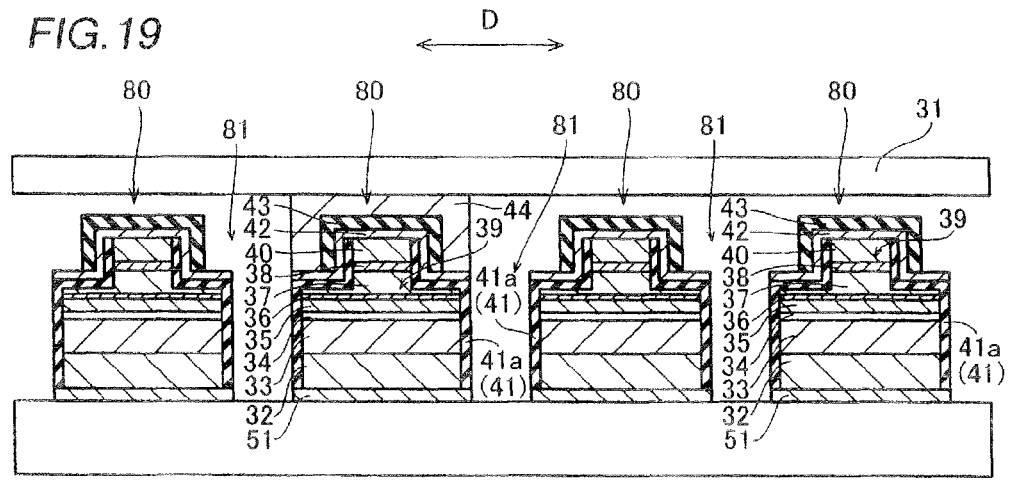
Figure 20:
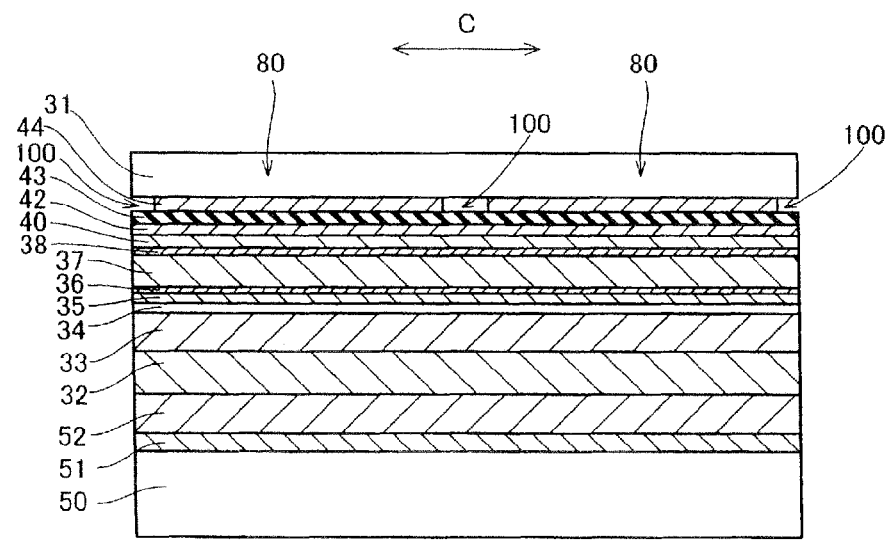

Thereafter the p-side pad electrodes 42 of the semiconductor laser diode portions 80 are bonded to the support substrate 31 through the adhesive layers 44 made of AuSn each having a thickness of about 5 μm, as shown in FIG. 19. At this time, according to the first embodiment, every eight semiconductor laser diode portions 80 are bonded to the support substrate 31 in the direction D.

Figure 22:
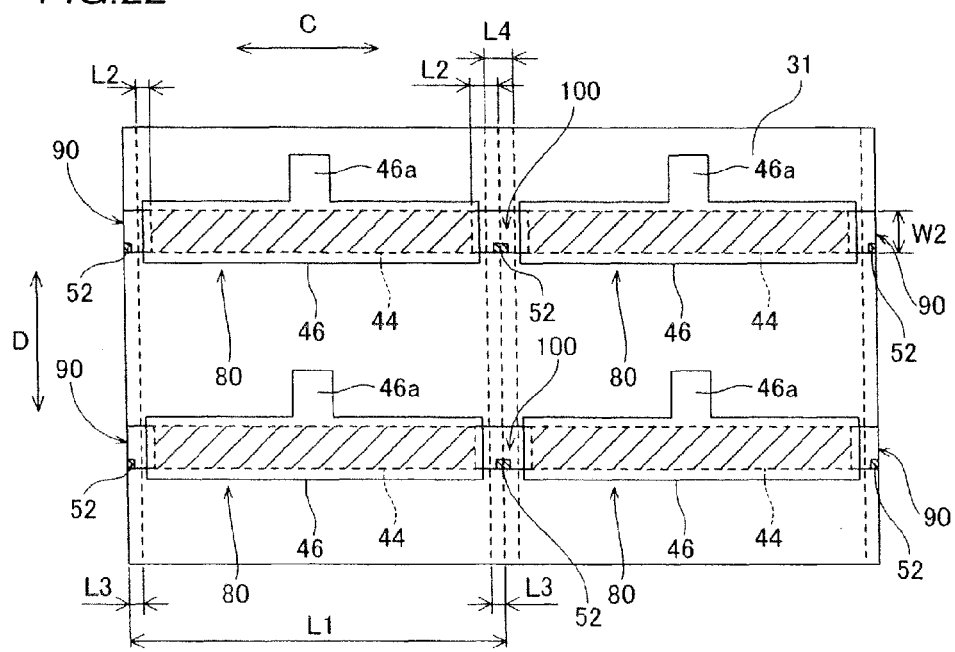
FIGS. 22 and 23 are bottom plan views for illustrating a process of fabricating the semiconductor laser diode according to the first embodiment shown in FIG. 13.

According to the first embodiment, the adhesive layers 44 having a width (W2) of about 50 μm are previously patterned in a striped matter on a surface closer to the semiconductor laser diode portions 80 of the support substrate 31 except ends in the direction C of the semiconductor laser diode portions 80 in a period of about 400 μm in the direction D, as shown in FIG. 22.

As shown in FIG. 20, the semiconductor laser diode portions 80 and the support substrate 31 are bonded (fusion bonded) to each other such that the regions 100 where no adhesive layer 44 is provided exist.

Figure 21:
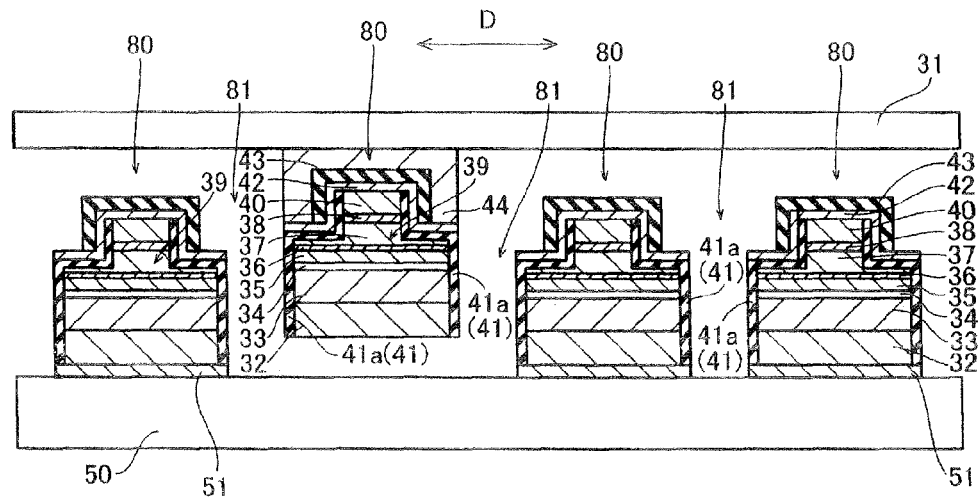

Thereafter only the separative layers 51 on the lower surfaces of some of the semiconductor laser diode portions 80 bonded to the support substrate 31 is irradiated with a laser beam having a wavelength of 532 nm and the separative layers 51 are decomposed and evaporated, as shown in FIG. 21. The separative layers 51 absorb the laser beam having a wavelength of 532 nm, while the substrates (the support substrate 31 and the GaN substrate 50) or the semiconductor layers does not absorb the same. The separative layers 51 according to the first embodiment are each made of a material having a band gap smaller than that of the semiconductor layer, which is an example of a material having a melting point or a boiling point lower than that of the semiconductor layer or a material easily decomposed as compared with that of the semiconductor layer. Thus, some of the semiconductor laser diode portions 80 bonded to the support substrate 31 are separated from the GaN substrate 50 as shown in FIG. 21. Then steps from a step of bonding some of the semiconductor laser diode portions 80 to the support substrate 31 to a step of separating the some of the semiconductor laser diode portions 80 from the GaN substrate 50 are repeated eight times, thereby obtaining eight support substrates 31 having the semiconductor laser diode portions 80.

Thereafter the outer portions 41b of the insulating films 41 made of $SiO_2$ or the like are formed on from the side surfaces of the semiconductor laser diode portions 80 to the lower surfaces of the support substrate 31, as shown in FIG. 15. The n-side ohmic electrodes 45 made of Al each having a thickness of about 10 nm are formed on the lower surfaces of the n-type contact layer 32 from the n-type contact layer 32 sides and the n-side pad electrodes 46 made of Ti having a thickness of about 20 nm, Pt having a thickness of about 20 μm and Au having a thickness of about 300 nm are formed from the n-side ohmic electrodes 45 to the support substrate 31. At this time, the protruding portions 46a protruding toward a first side in the direction D is formed on the center in the direction C of the n-side pad electrode 46, as shown in FIG. 22.

Then scribe grooves 52 are provided on surfaces of the semiconductor laser diode portions 80, perpendicular to a principal surface of the support substrate 31, and the cavity planes 90 are formed by cleaving so as to have the (1-100) planes of the semiconductor laser diode portions 80 with an ultrasonic wave. The scribe grooves 52 are so formed as to pass through the semiconductor laser diode portions 80 in the range of about 10 μm from one side of the semiconductor laser diode portions 80 by laser scribing. The scribe grooves 52 may be formed by scribing with a diamond cutter or the like. The scribe grooves 52 may be formed on both sides of the semiconductor laser diode portions 80.

The cleavage of the semiconductor laser diode portions 80 is performed along the cleavage planes of the semiconductor laser diode portions 80 on the regions 100 where no adhesive layer 44 is provided in the vicinity of the ends closer to the support substrate 31 of the regions employed as the cleavage planes (cavity planes 90) (upper side).

Figure 23:
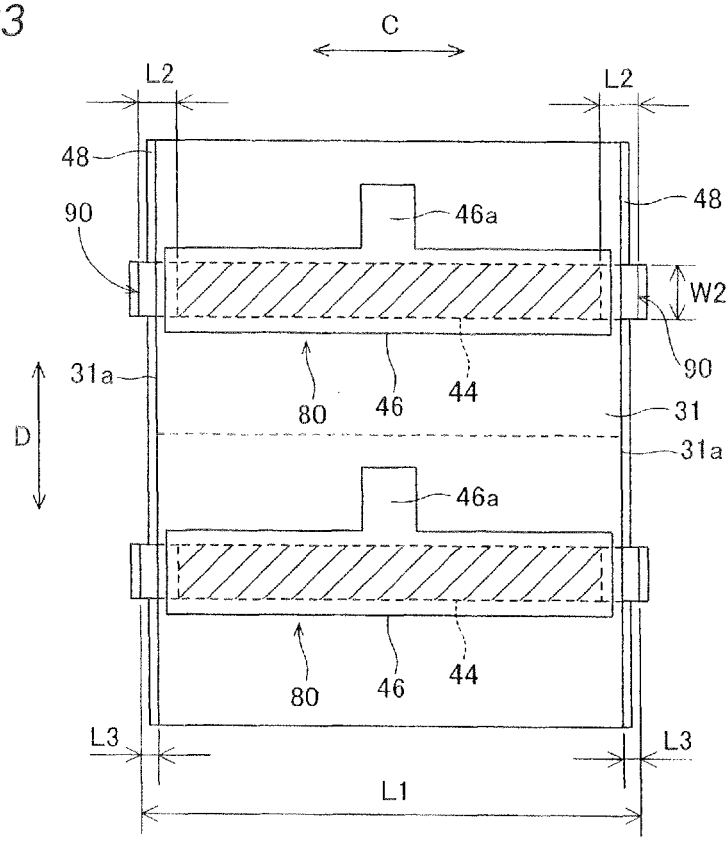

The device division of the semiconductor laser diode portions 80 is performed along the direction D by dicing only the support substrate 31 with a width (L4) of about 40 μm. Thus, the support substrate 31 in the form of a bar extending in the direction D is prepared as shown in FIG. 23. Thereafter the dielectric multilayer films 48 are formed from the cavity planes 90 to side end surfaces 31a of the support substrate 31. Finally, the center between the semiconductor laser diode portions 80 are divided along the direction C such that the width (length) W11 (see FIG. 13) in the direction D of each semiconductor laser diode portion 80 is about 400 μm. The semiconductor laser diode according to the first embodiment shown in FIG. 13 is formed by wire-bonding with the metal wire 47 (see FIG. 13) on the surface of the protruding portion 46a of the n-side pad electrode 46.

According to the first embodiment, as hereinabove described, the process of fabricating the semiconductor laser diode comprises the step of forming the plurality of semiconductor laser diode portions 80 on the GaN substrate 50 at the prescribed intervals in the direction D and the step of bonding some of the plurality of semiconductor laser diode portions 80 to the support substrate 31, whereby the length in the direction D (W11=about 400 μm) of each semiconductor laser diode (support substrate) can be larger than (about ten times) the length (W12=about 40 μm) in the direction D of the semiconductor laser diode portion 80 dissimilarly to all the plurality of semiconductor laser diode portions 80 are bonded to the support substrate 31. Thus, the width of the support substrate 31 can be inhibited from reduction also in a case where the width of the semiconductor laser diode portion 80 formed on the GaN substrate 50 is reduced. Consequently, the semiconductor laser diode including the semiconductor laser diode portion 80 and the support substrate 31 can be inhibited from excessive reduction, and hence handling of the semiconductor laser diode can be inhibited from becoming difficult.

According to the first embodiment, the process of fabricating the semiconductor laser diode comprises the step of dividing only the support substrate 31 along the direction C (cleavage plane direction) wherein the step of dividing the support substrate 31 along the direction C includes the step of dividing such that the length in the direction D of the support substrate 31 (W11=about 400 μm) is larger than the length in the direction D of the semiconductor laser diode portion 80 (W12=about 40 μm) whereby the width of the substrate 31 is large even when a semiconductor laser diode portion 80 having a small width is formed and hence the semiconductor laser diode can be easily handled.

According to the first embodiment, every eight semiconductor laser diode portions 80 among the plurality semiconductor laser diode portions 80 are bonded to the support substrate 31 and separated from the GaN substrate 50, whereby the length in the direction D (W11=about 400 μm) of the support substrate 31 can be larger than the length (W12=about 40 μm) in the direction D of the semiconductor laser diode portion 80.

According to the first embodiment, the n-side pad electrode 46 is electrically connected to the surface farther from the support substrate 31 of the semiconductor laser diode portion 80 (lower surface) and is so formed as to extend the surface of the support substrate 31 adjacent to the semiconductor laser diode portion 80, whereby the n-side pad electrode 46 so formed as to extend on the surface of the support substrate 31 can be wire-bonded without wire bonding onto the surface farther from the support substrate 31 of the semiconductor laser diode portion 80 (lower surface) having a smaller width also in a case where the width of the semiconductor laser diode portion 80 is reduced. Thus, electrical connection to the surface farther from the support substrate 31 of the semiconductor laser diode portion 80 can be easily performed.

According to the first embodiment, the regions 100 where no adhesive layer 44 bonding the support substrate 31 and the semiconductor laser diode portion 80 is provided, are provided in the vicinity of the ends closer to the support substrate 31 of the cavity planes 90 of the semiconductor laser diode portions 80 (upper side), whereby the regions where the support substrates 31 and the semiconductor laser diode portions 80 are separated from each other can be formed in the vicinity of the side closer to the support substrate of the cavity planes 90 of the semiconductor laser diode portions 80 by the regions 100 where no adhesive layer 44 is provided. Thus, the semiconductor laser diode portions 80 can be cleaved without being influenced by cleavability of the support substrate 31 dissimilarly to a case where the adhesive layers 44 and the support substrates 31 are provided adjacent to the ends closer to the support substrate 31 of the cavity planes 90. Consequently, flatness of the cleavage planes of the semiconductor laser diode portions 80 can be improved also in a case where the support substrate 31 made of Cu—W having no cleavability is employed.

According to the first embodiment, the support substrate 31 and the adhesive layers 44 are so formed as to have conductivity, whereby the conductive support substrate 31 and the semiconductor laser diode portions 80 can be bonded to each other through the conductive adhesive layers 44, and hence the semiconductor laser diode portions 80 and the support substrate 31 can be electrically connected to each other.

According to the first embodiment, a plurality of the adhesive layers 44 are each formed so as to have the width W2 (=about 50 μm) substantially equal to the width in the direction D of the semiconductor laser diode portion 80 to be bonded in a striped matter in a period of about 400 μm in the direction D, whereby each adhesive layers 44 has an area substantially equal to the bonding region of the semiconductor laser diode portion 80 and hence the semiconductor laser diode portion 80 can be reliably bonded to the support substrate 31.

According to the first embodiment, each of the adhesive layers 44 is formed at the distances (L2) of about 25 μm inside with respect to extensions of the cavity planes 90, whereby the regions 100 where no adhesive layer 44 is provided can be easily formed in the vicinity of the ends closer to the support substrate 31 of the cavity planes 90.

According to the first embodiment, the dielectric multilayer films 48 are formed so as to extend along the cavity planes 90 of the semiconductor laser diode portion 80 and the side end surfaces 31a of the support substrate 31 substantially parallel to the cavity planes 90, whereby it is possible to easily form the cavity planes 90 having desired reflectance with the thickness of each dielectric multilayer film 48.

First Modification of First Embodiment

Figure 24:
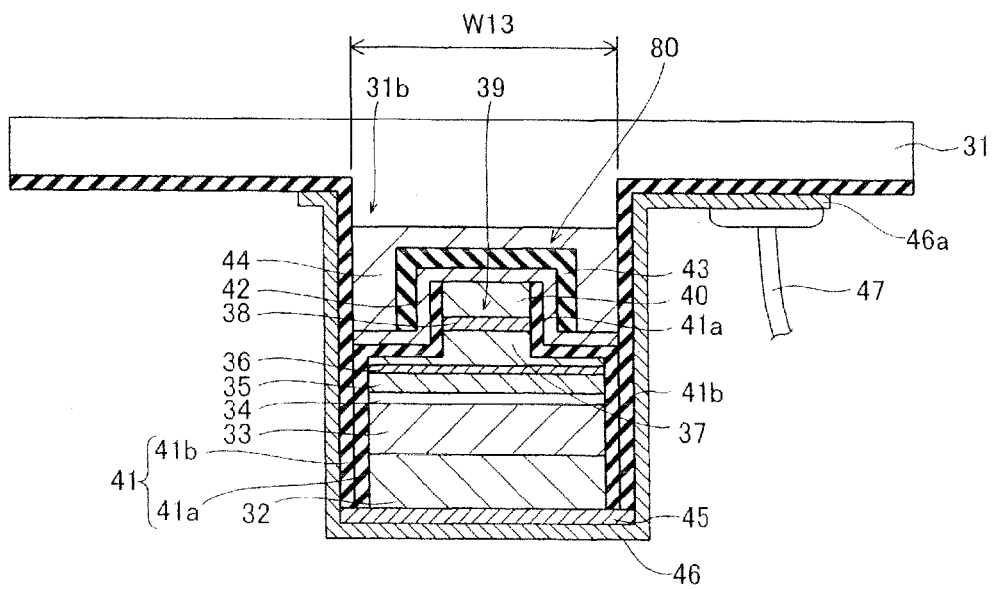
FIG. 24 is a sectional view of a semiconductor laser diode according to a first modification of the first embodiment of the present invention.

Referring to FIG. 24, a semiconductor laser diode portion 80 is bonded to a support substrate 31 formed with a projecting portion 31b in a prescribed region in a semiconductor laser diode according to a first modification of the first embodiment, dissimilarly to the aforementioned first embodiment.

In the semiconductor laser diode portion 80 according to the first modification of the first embodiment, the semiconductor laser diode portions 80 are bonded onto the projecting portions 31b previously formed on a surface of the support substrate 31 to which the semiconductor laser diode portions 80 are bonded, through adhesive layers 44, as shown in FIG. 24. Each projecting portion 31b has a height of about 5 μm and the width of each projecting portion 31b in a direction D is substantially the same as a width W13 (about 45 μm) of the p-side pad electrode 42 of the semiconductor laser diode portion 80. Therefore, outer portions 41b of insulating films 41 are so formed as to cover side surfaces of the projecting portions 31b of the support substrate 31 and extend on a lower surface other than the projecting portions 31b of the support substrate 31.

The remaining structure of the semiconductor laser diode according to the first modification of the first embodiment and the remaining process of fabricating the same are similar to those of the semiconductor laser diode according to the aforementioned first embodiment.

According to the first modification of the first embodiment, as hereinabove described, the support substrate 31 previously formed with the projecting portions 31b are employed, whereby the molten adhesive layers 44 does not flow from the projecting portions 31b onto the surface (non-bonding region of the surface) of the support substrate 31 other than the projecting portions 31b when the projecting portions 31b of the support substrate 31 are employed as bonding surfaces to the semiconductor laser diode portions 80, and hence the semiconductor laser diode portions 80 and the support substrate 31 can be reliably bonded with the adhesive layers 44. Additionally, the adhesive layers 44 can be inhibited from flowing out in the direction D and being fusion bonded to the adjacent semiconductor laser diode portions 80 when bonding.

According to the first modification of the first embodiment, the projecting portions 31b are formed to each have a width substantially equal to a width W13 (about 45 μm) of the p-side pad electrode 42 of the semiconductor laser diode portion 80, whereby each projecting portion 31b has an area substantially equal to a bonding region of the semiconductor laser diode portion 80 and hence the semiconductor laser diode portions 80 can be reliably bonded to the support substrate 31 through the adhesive layers 44.

Second Modification of First Embodiment

Figure 25:
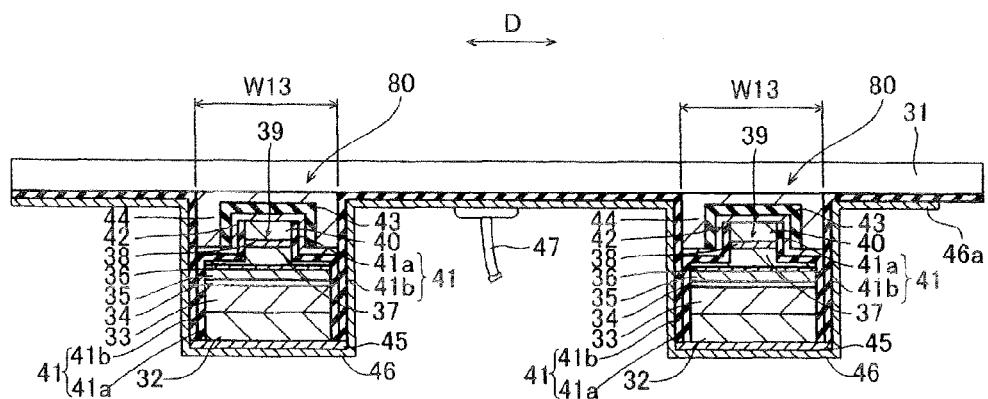
FIG. 25 is a sectional view of a semiconductor laser diode according to a second modification of the first embodiment of the present invention.
Figure 26:
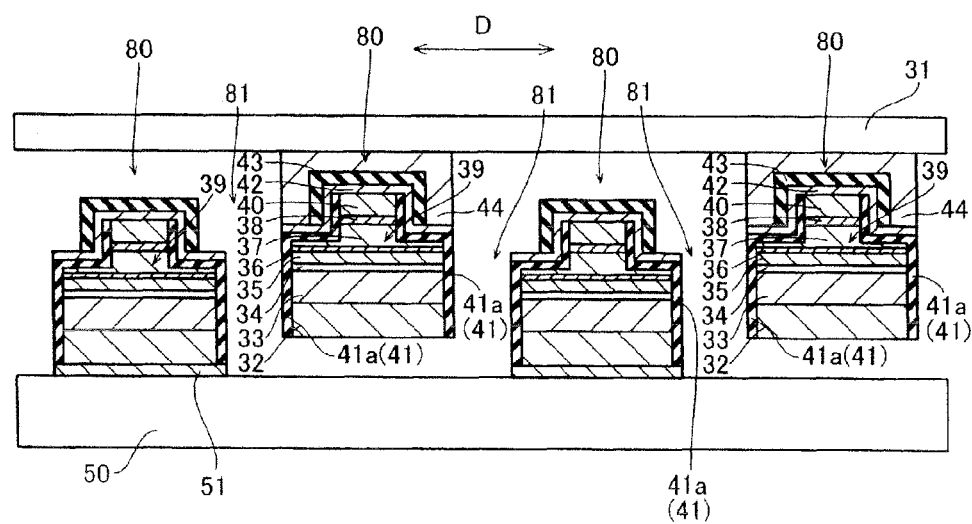
FIG. 26 is a sectional view for illustrating a process of fabricating the semiconductor laser diode according to the second modification of the first embodiment shown in FIG. 25.

Referring to FIGS. 25 and 26, a plurality of semiconductor laser diode portions 80 are bonded to a common support substrate 31 and arrayed in a semiconductor laser diode chip according to a second modification of the first embodiment, dissimilarly to the aforementioned first embodiment.

According to the second modification of the first embodiment, a p-side electrode (support substrate 31) and an n-side electrode (n-side pad electrode 46) are employed as common electrodes respectively, and the plurality of semiconductor laser diode portions 80 each having the structure similar to that of the aforementioned first embodiment are bonded to the support substrate 31 and arrayed in a direction D, as shown in FIG. 25.

In a process of fabricating the semiconductor laser diode chip according to the second modification of the first embodiment, every two semiconductor laser diode portions 80 are bonded to the one support substrate 31 through the adhesive layer 44 as shown in FIG. 26. In other words, the adjacent semiconductor laser diode portions 80 are bonded to the support substrate 31 at a prescribed interval larger than the width in the direction D of one semiconductor laser diode portion 80 (width W13 of the p-side pad electrode 42). After removing the separative layers 51 with laser irradiation, outer portions 41b of insulating films 41 are formed on from side surfaces of the semiconductor laser diode portions 80 to a lower surface of the support substrate 31, as shown in FIG. 25. Thereafter the n-side ohmic electrodes 45 are formed and the n-side pad electrode 46 is so formed as to extend on from the n-side ohmic electrodes 45 to the support substrate 31. Then a metal wire 47 is wire-bonded on the surface of the n-side pad electrode 46, thereby forming the semiconductor laser diode chip shown in FIG. 25

The remaining structure of the semiconductor laser diode according to the second modification of the first embodiment and the remaining process of fabricating the same are similar to those of the semiconductor laser diode according to the aforementioned first embodiment. The effects of the second modification of the first embodiment are similar to those of the aforementioned first embodiment.

Third Modification of First Embodiment

Referring to FIGS. 17 and 27 to 30, a GaN substrate 50 employed as a growth substrate is separated by removing selective growth masks 60 made of $SiO_2$ by etching after forming the selective growth masks 60 on prescribed regions of the GaN substrate 50, forming a semiconductor layer on the selective growth masks 60 and the GaN substrate 50, and bonding devices (semiconductor laser diode portions 80) to a support substrate 31 in a process of fabricating a semiconductor laser diode according to a third modification of the first embodiment, dissimilarly to the aforementioned first embodiment.

Figure 27:
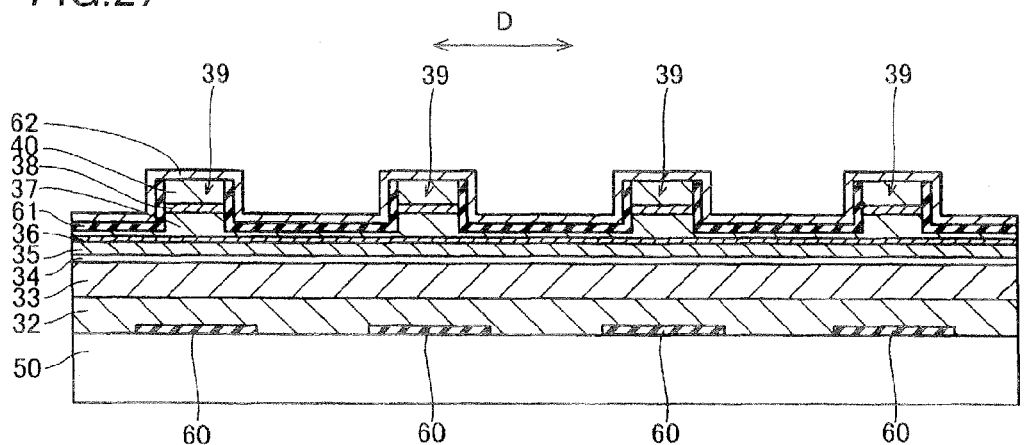
FIGS. 27 to 30 are sectional views for illustrating a process of fabricating a semiconductor laser diode according to a third modification of the first embodiment of the present invention.

In the process of fabricating the semiconductor laser diode according to the third modification of the first embodiment, the selective growth masks 60 made of $SiO_2$ each having a width in a direction D of about 10 μm are formed on prescribed regions of the GaN substrate 50 at intervals of about 10 μm in the direction D in a striped manner, as shown in FIG. 27.

Thereafter an n-type contact layer 32 to a p-side contact layer 38 are grown on the GaN substrate 50 by MOVPE similarly to the first embodiment and p-side ohmic electrodes 40 are formed on the p-side contact layer 38 by vacuum evaporation or the like. Then insulating films 41c (see FIG. 17) is employed as masks for dry-etching, thereby forming ridge portions 39, similarly to the first embodiment.

In the process of fabricating the semiconductor laser diode according to the third modification of the first embodiment, the insulating films 61 made of $Al_2O_3$ each having a thickness of about 250 nm are so formed as to cover upper surfaces of planar portions of a p-type cladding layer 37 and side surfaces of the ridge portions 39. Thereafter a p-side pad electrode 62 is so formed as to cover upper surfaces of the insulating films 61 and the p-side ohmic electrodes 40.

Figure 28:
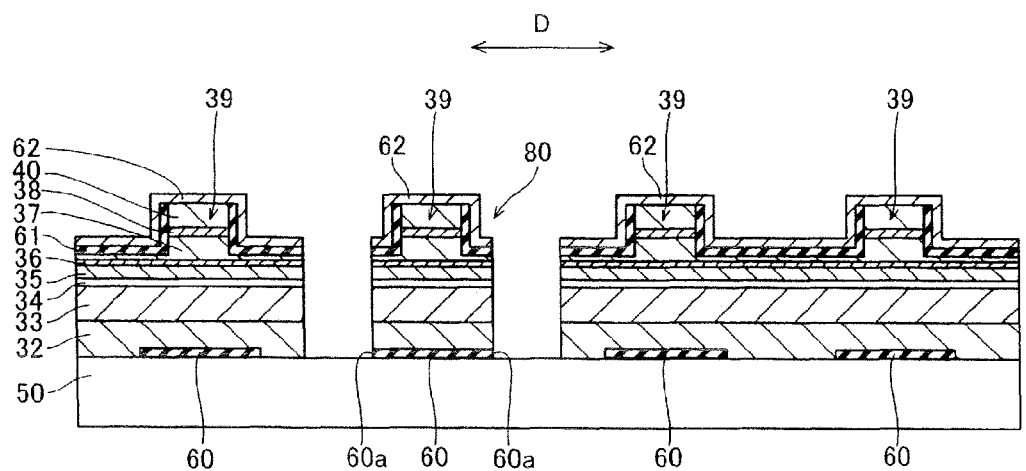

As shown in FIG. 28, the n-type contact layer 32 to the p-side pad electrode 62 are partially etched by dry-etching so that some of the devices (semiconductor laser diode portions 80) are isolated. At this time, ends 60a (two portions) in the direction D of the selective growth masks 60 are exposed. Thus, individual semiconductor laser diode portions 80 are formed on the GaN substrate 50 at prescribed intervals in the direction D.

Figure 29:
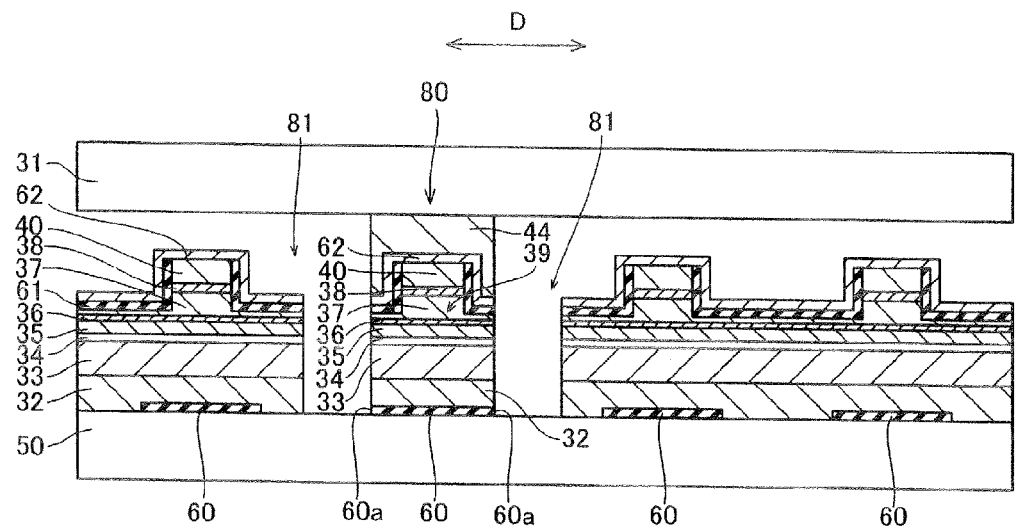

Thereafter the p-side pad electrodes 62 of the semiconductor laser diode portion 80 are bonded to the support substrate 31 through adhesive layers 44 made of AuSn having a thickness of about 5 μm, as shown in FIG. 29.

Figure 30:
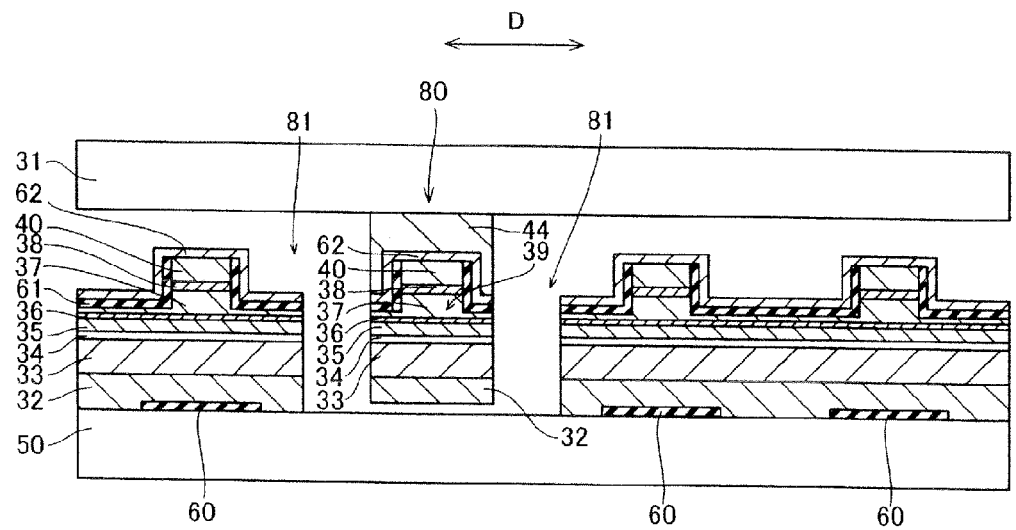

As shown in FIG. 30, the selective growth mask 60 is removed by wet etching employing buffered hydrofluoric acid. Thus, some of the semiconductor laser diode portions 80 bonded to the support substrate 31 are separated from the GaN substrate 50 as shown in FIG. 30.

The remaining structure of the semiconductor laser diode according to the third modification of the first embodiment and the remaining process of fabricating the same are similar to those of the semiconductor laser diode according to the aforementioned first embodiment. The effects of the third modification of the first embodiment are similar to those of the aforementioned first embodiment.

Second Embodiment

Figure 31:
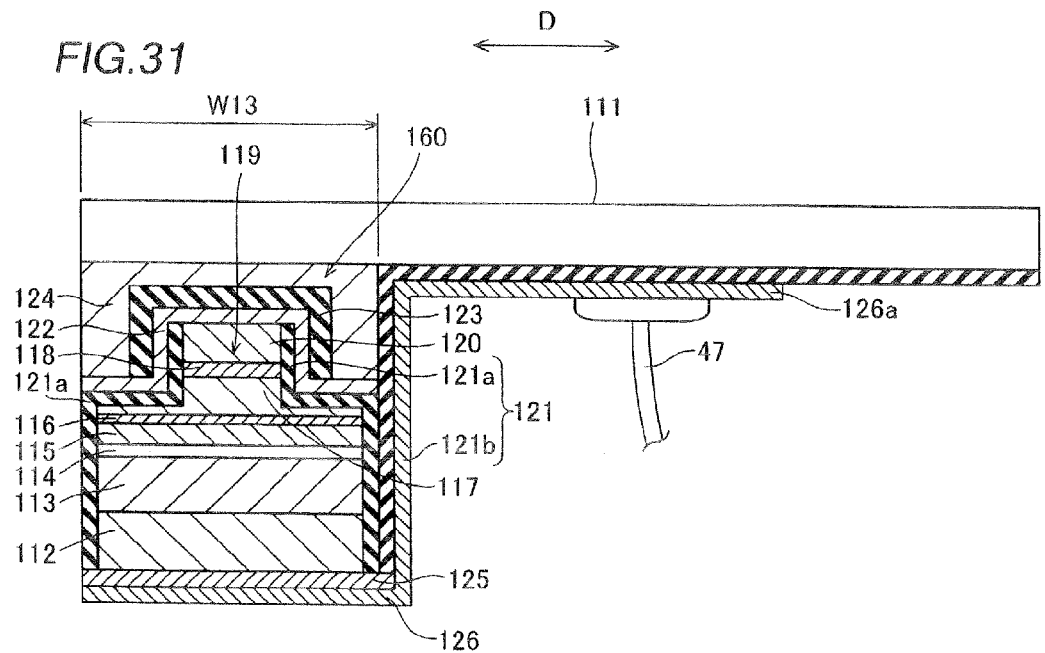
FIG. 31 is a sectional view of a semiconductor laser diode according to a second embodiment of the present invention.

Referring to FIG. 31, a semiconductor laser diode portion 160 is formed on an end of a semiconductor laser diode according to a second embodiment dissimilarly to the aforementioned first embodiment.

In the semiconductor laser diode according to the second embodiment, a support substrate 111 and the semiconductor laser diode portion 160 are bonded to each other through an adhesive layer 124 as shown in FIG. 31, similarly to the aforementioned first embodiment. The support substrate 111 is an example of the "second substrate" and the "substrate" in the present invention, and the semiconductor laser diode portion 160 is an example of the "first semiconductor laser diode portion" in the present invention.

According to the second embodiment, the semiconductor laser diode portion 160 is formed on the end on one side in a direction D of the support substrate 111.

An n-type cladding layer 113, a light-emitting layer 114, a p-type light guide layer 115, a p-type cap layer 116, a p-type cladding layer 117 and a p-type contact layer 118 are formed on a n-type contact layer 112 similarly to the aforementioned first embodiment. A projecting portion of the p-type cladding layer 117 and the p-type contact layer 118 constitutes a ridge portion 119 employed as a current path. A p-side ohmic electrode 120 is formed on the p-type contact layer 118.

Inner portions 121a of an insulating film 121 are formed on side surfaces of the n-type contact layer 112, the n-type cladding layer 113, the light-emitting layer 114, the p-type light guide layer 115, the p-type cap layer 116, the ridge portion 119 and the p-side ohmic electrode 120.

According to the second embodiment, an outer portion 121b of the insulating film 121 is formed on side surfaces on a second side (inner side) of the inner portions 121a of the insulating film 121 and the adhesive layer 124 and a lower surface of the support substrate 111.

A p-side pad electrode 122 and an insulating film 123 are formed on an upper surface of the inner portions 121a of the insulating film 121 and an upper surface of the p-side ohmic electrode 120 similarly to the aforementioned first embodiment. An n-side ohmic electrode 125 and an n-side pad electrode 126 are formed on a back surface (lower surface) of the n-type contact layer 112 from a side closer to the n-type contact layer 112. The n-side pad electrode 126 is an example of the "electrode layer" in the present invention.

According to the second embodiment, the n-side pad electrode 126 is electrically connected to a surface farther from the support substrate 111 of the semiconductor laser diode portion 160 (lower surface) and is formed so as to extend on the surface of the support substrate 111 adjacent to the semiconductor laser diode portion 160 (lower surface).

The remaining structure of the semiconductor laser diode according to the second embodiment is similar to that of the aforementioned first embodiment.

A process of fabricating the semiconductor laser diode according to the second embodiment will be now described with reference to FIGS. 31 to 35.

Figure 32:
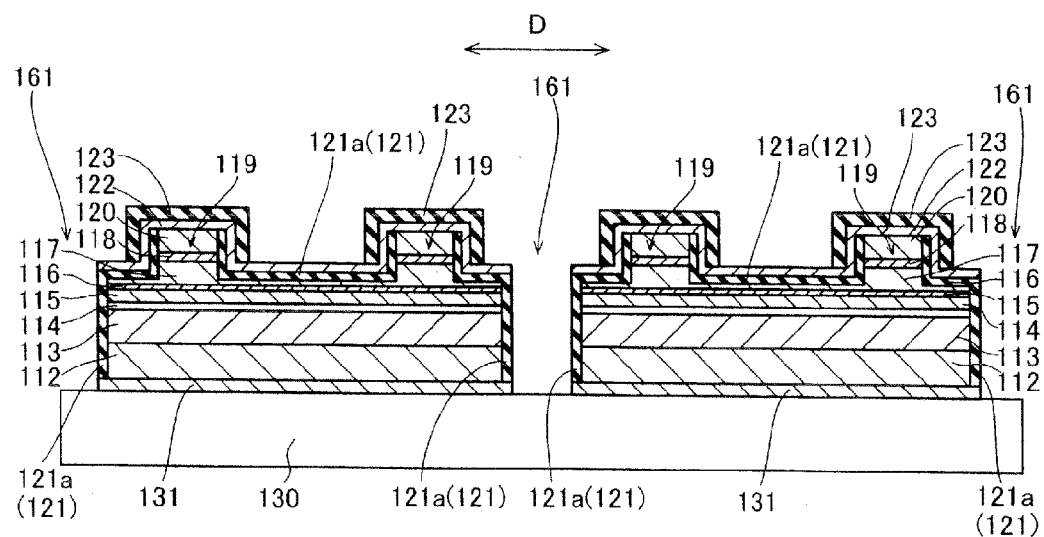
FIGS. 32 and 33 are sectional views for illustrating a process of fabricating the semiconductor laser diode according to the second embodiment shown in FIG. 31.

The layers up to the p-type contact layer 118 are formed through a process similar to that of the aforementioned first embodiment, and the p-side ohmic electrode 120 and the insulating film (not shown) are successively formed and patterned. Then the ridge portions 119 are formed in a period of about 50 µm, as shown in FIG. 32. Thereafter isolation grooves 161 are formed in a period of about 100 µm by partially etching from a separative layer 131 to planar portions of the p-type cladding layer 117 with a width of about 10 µm, and the layers from the separative layer 131 to the p-type cladding layer 117 are patterned so as to each have a width of about 90 µm.

According to the second embodiment, each of portions divided with the isolation grooves 161 includes two ridge portions 119. The semiconductor laser diode portion 160 is so formed as to have a first side in the direction D linked to another semiconductor laser diode portion 160. Thereafter the inner portions 121a of the insulating films 121 and the p-side pad electrodes 122 and the insulating films 123 are formed similarly to the first embodiment.

Figure 33:
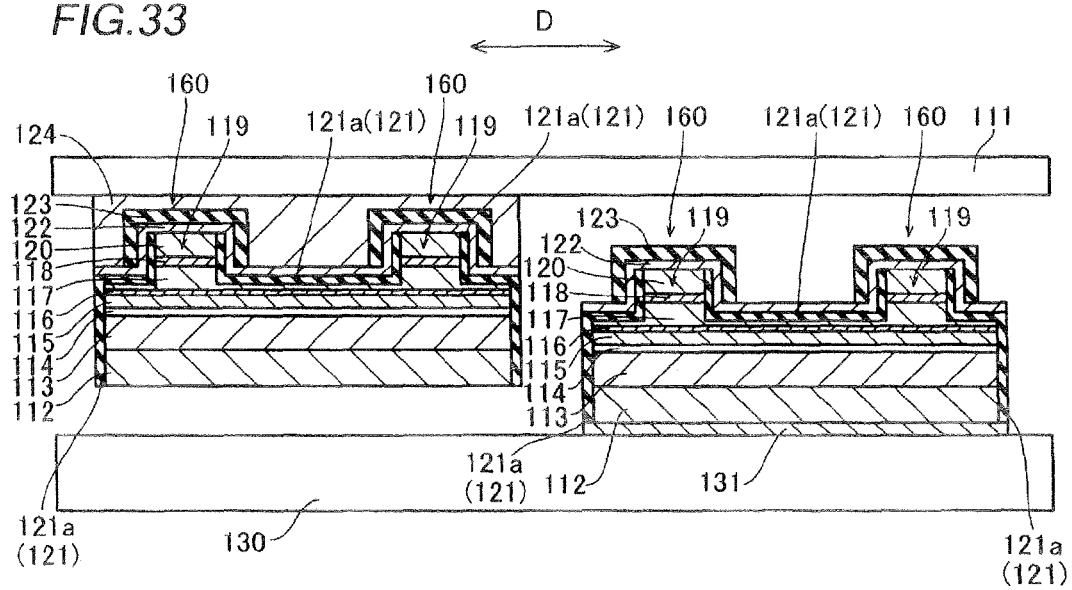
Figure 34:
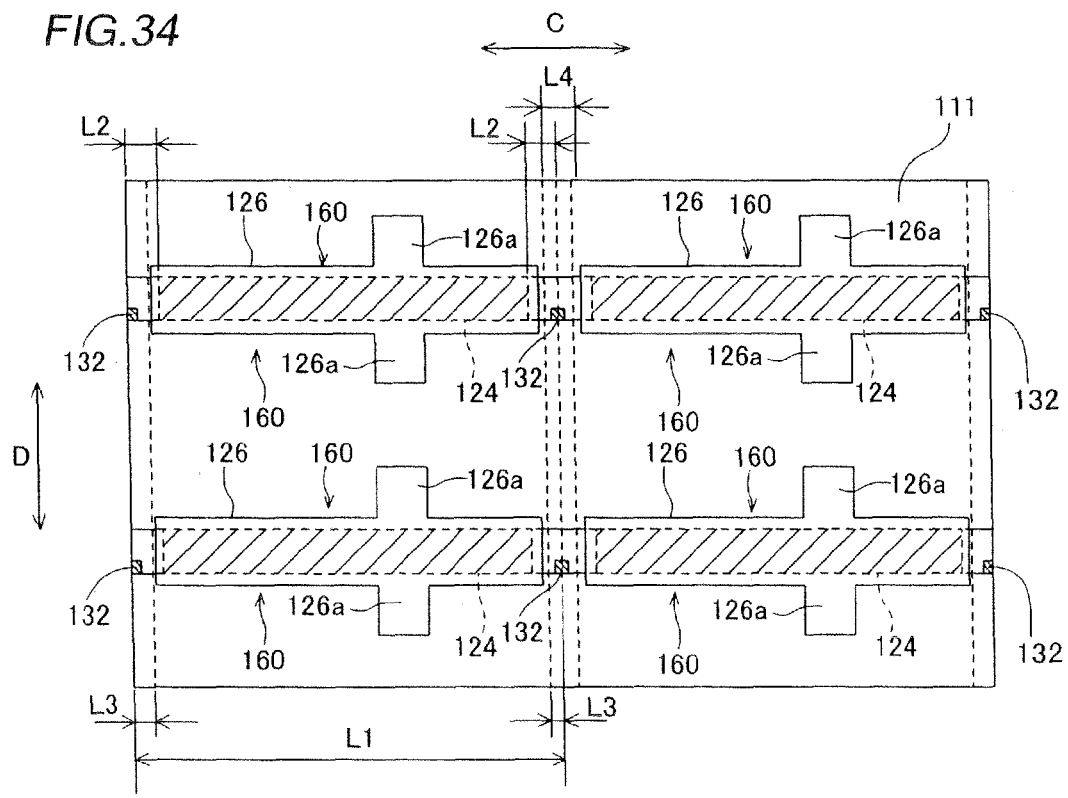
FIGS. 34 and 35 are bottom plan views for illustrating a process of fabricating the semiconductor laser diode according to the second embodiment shown in FIG. 31.

Thereafter the semiconductor laser diode portions 160 are bonded to the support substrate 111 through the adhesive layers 124 as shown in FIG. 33. According to the second embodiment, the adhesive layers 124 each having a width of about 90 µm are previously patterned in a striped matter on a surface closer to the semiconductor laser diode portions 160 of the support substrate 111 in a period of about 400 µm in the direction D, as shown in FIG. 34.

Thereafter some semiconductor laser diode portions 160 bonded to the support substrate 111, each having the one side in the direction D linked to another semiconductor laser diode portion 160 are separated from a GaN substrate 130 as shown in FIG. 33, similarly to the first embodiment. The GaN substrate 130 is an example of the "first substrate" in the present invention. Then steps from a step of bonding some of the semiconductor laser diode portions 160 to the support substrate 111 to a step of separating the some of the semiconductor laser diode portions 160 from the GaN substrate 130 are repeated four times, thereby obtaining four support substrates 111 having the semiconductor laser diode portions 160.

Thereafter the outer portions 121b of the insulating films 121 (see FIG. 31) made of SiO$_2$ or the like are formed on the side surfaces of the semiconductor laser diode portions 160 to the lower surfaces of the support substrate 111. Then the n-side ohmic electrodes 125 and the n-side pad electrodes 126 (see FIG. 31) are formed on the lower surfaces of the n-type contact layers 112. According to the second embodiment, at this time, protruding portions 126a protruding toward both sides in the direction D are each formed on a portion closer to one side from the center in the direction C of the n-side pad electrode 126 as shown in FIG. 34.

Then scribe grooves 132 are provided on surfaces of the semiconductor laser diode portions 160, perpendicular to a principal surface of the support substrate 111, and cavity planes 170 are formed by cleaving so as to have the (1-100) planes of the semiconductor laser diode portions 160 with an ultrasonic wave.

Figure 35:
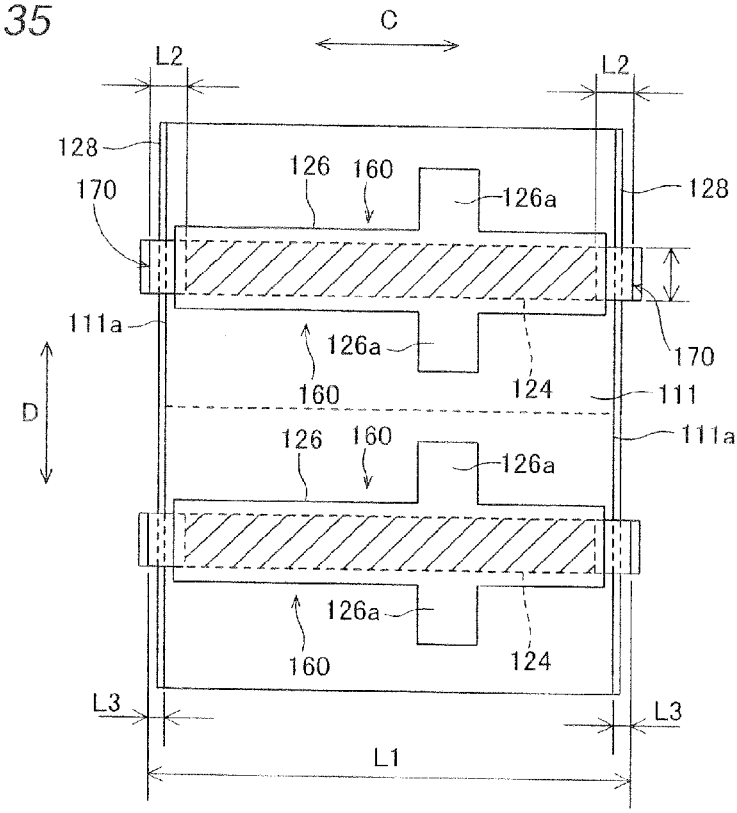

Thereafter the device division of the semiconductor laser diode portions 160 is performed along the direction D by dicing only the support substrate 111. Thus, the support substrate 111 in the form of a bar extending in the direction D is prepared as shown in FIG. 35. Thereafter dielectric multilayer films 128 are formed from the cavity planes 170 to side end surfaces 111a of the support substrate 111.

Finally, the centers between pairs of the semiconductor laser diode portions 160 linked to each other and the center between the semiconductor laser diode portions 160 and the semiconductor laser diode portions 160 are divided along the direction C. Thus, the semiconductor laser diode according to the second embodiment shown in FIG. 31 is formed.

The remaining process of fabricating the semiconductor laser diode according to the second embodiment is similar to the process of fabricating the semiconductor laser diode according to the aforementioned first embodiment.

According to the second embodiment, as hereinabove described, the semiconductor laser diode portions 160 each having the one side in the direction D linked to another semiconductor laser diode portion 160 are separated from the GaN substrate 130, whereby the semiconductor laser diode portions 160 can be separated from the GaN substrate 130 while increasing the widths in the direction D of the semiconductor layers and strength of the semiconductor layers. Thus, the semiconductor laser diode portions 160 can be inhibited from being damaged during the step of division.

The remaining effects of the second embodiment are similar to those of the aforementioned first embodiment.

Third Embodiment

Figure 36:
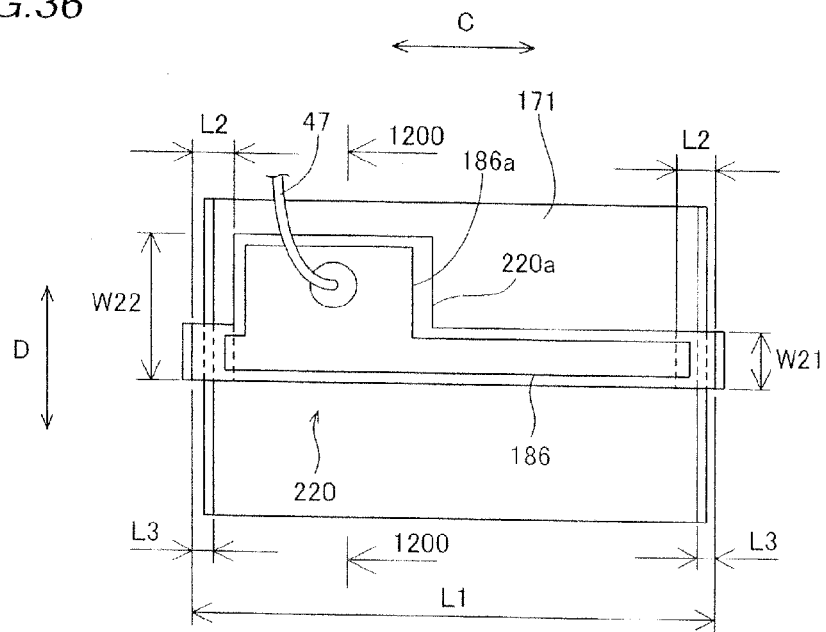
FIG. 36 is a bottom plan view of a semiconductor laser diode according to a third embodiment of the present invention.
Figure 37:
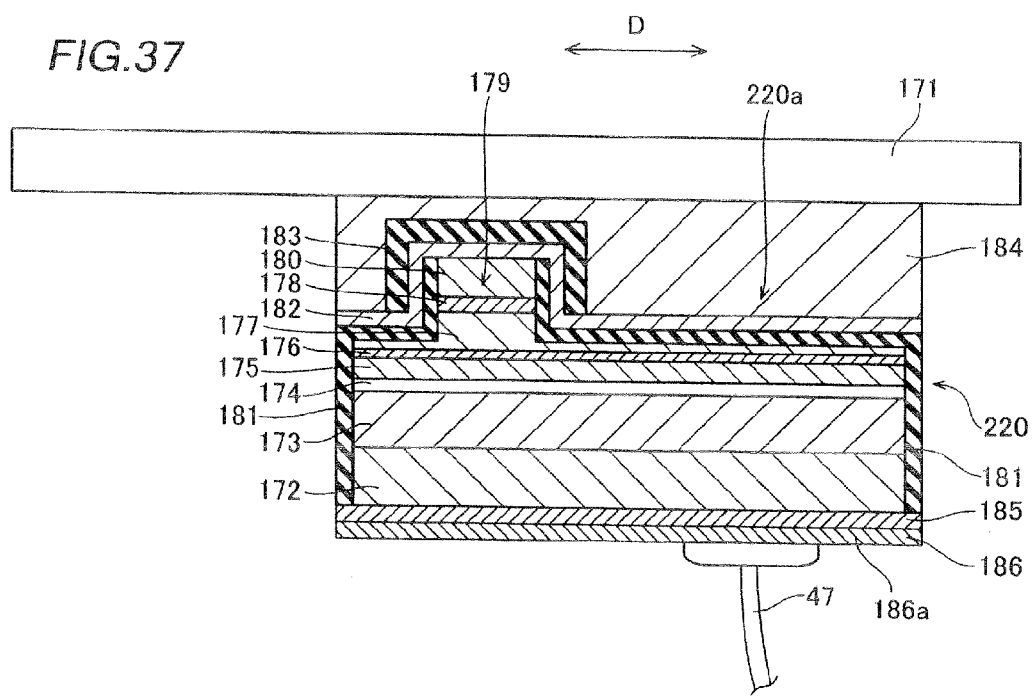
FIG. 37 is a sectional view taken along the line 1200-1200 in FIG. 36.

Referring to FIGS. 36 and 37, a semiconductor laser diode portion 220 according to a third embodiment has a protruding portion 220a protruding in a direction D dissimilarly to the aforementioned first embodiment.

In the semiconductor laser diode according to the third embodiment, a support substrate 171 and the semiconductor laser diode portion 220 are bonded to each other through an adhesive layer 184 as shown in FIG. 37, similarly to the aforementioned first embodiment. The support substrate 171 is an example of the "second substrate" and the "substrate" in the present invention, and the semiconductor laser diode portion 220 is an example of the "first semiconductor laser diode portion" in the present invention.

According to the third embodiment, the semiconductor laser diode portion 220 is formed with the protruding portion 220a protruding the direction D as shown in FIG. 36. A width (length) W21 in the direction D of the semiconductor laser diode portion 220 except the protruding portion 220a is about 30 µm and a width (length) W22 in the direction D of the semiconductor laser diode portion 220 including the protruding portion 220a is about 120 µm.

As shown in FIG. 37, an n-type cladding layer 173, a light-emitting layer 174, a p-type light guide layer 175, a p-type cap layer 176, a p-type cladding layer 177 and a p-type contact layer 178 are formed on an n-type contact layer 172 similarly to the aforementioned first embodiment. A projecting portion of the p-type cladding layer 177 and the p-type contact layer 178 constitute the ridge portion 179 employed as a current path. A p-side ohmic electrode 180 is formed on the p-type contact layer 178.

Insulating films 181 are formed on side surfaces of the n-type contact layer 172, the n-type cladding layer 173, the light-emitting layer 174, the p-type light guide layer 175, the p-type cap layer 176, the ridge portion 179 and the p-side ohmic electrode 180.

According to the third embodiment, the insulating films 181 are not formed on side surfaces of the adhesive layer 184 and a lower surface of the support substrate 171 dissimilarly to the aforementioned first embodiment.

A p-side pad electrode 182 and the insulating film 183 are formed on an upper surface of the insulating films 181 and an upper surface of the p-side ohmic electrode 180 similarly to the aforementioned first embodiment. An n-side ohmic electrode 185 and an n-side pad electrode 186 are formed on a back surface (lower surface) of the n-type contact layer 172 from a side closer to the n-type contact layer 172. The n-side pad electrode 186 is an example of the "electrode layer" in the present invention.

According to the third embodiment, the n-side pad electrode 186 is formed only on a side farther from the support substrate 171 of the semiconductor laser diode portion 220 (lower surface).

According to the third embodiment, a metal wire 47 is wire-bonded on a protruding portion 186a of the n-side pad electrode 186 formed on a lower surface of the protruding portion 220a of the semiconductor laser diode portion 220 as shown in FIGS. 36 and 37.

The remaining structure of the semiconductor laser diode according to the third embodiment is similar to that of the aforementioned first embodiment.

A process of fabricating the semiconductor laser diode according to the third embodiment will be described with reference to FIGS. 36 to 41.

Figure 38:
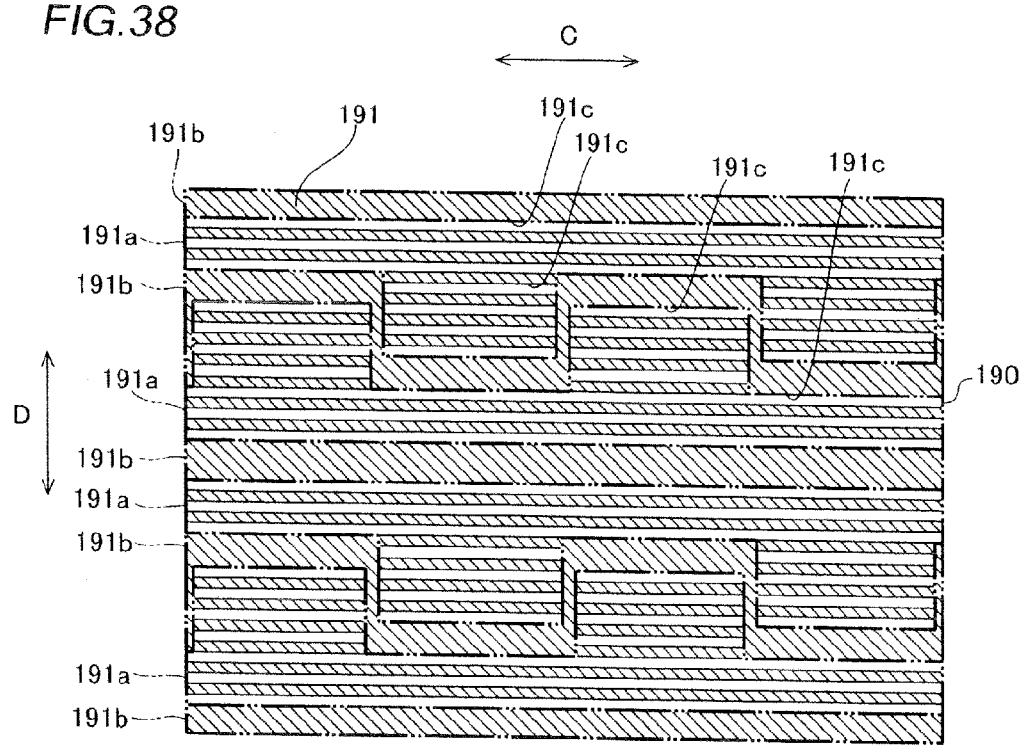
FIGS. 38 and 39 are plan views for illustrating a process of fabricating the semiconductor laser diode according to the third embodiment shown in FIG. 36.

According to the third embodiment, a selective growth mask 191 made of SiN, having a thickness of about 200 nm is formed on a sapphire substrate 190 employed as a growth substrate, as shown in FIG. 38. The sapphire substrate 190 is an example of the "first substrate" in the present invention. The patterns of the selective growth mask are constituted by growth regions 191a and isolation groove forming regions 191b. The growth regions 191a are each formed with a plurality of openings 191c each having a width of about 300 nm in the selective growth mask 191 in a period of about 1 μm in the direction D. On the other hand, the selective growth mask 191 is formed on overall surfaces of the isolation groove forming regions 191b. The selective growth mask 191 has a function as a separative layer. The selective growth mask 191 is an example of a material easily decomposed as compared with the semiconductor layer, a material easily dissolved as compared with the semiconductor layer, or a material easily reacting as compared with the semiconductor layer.

Figure 39:
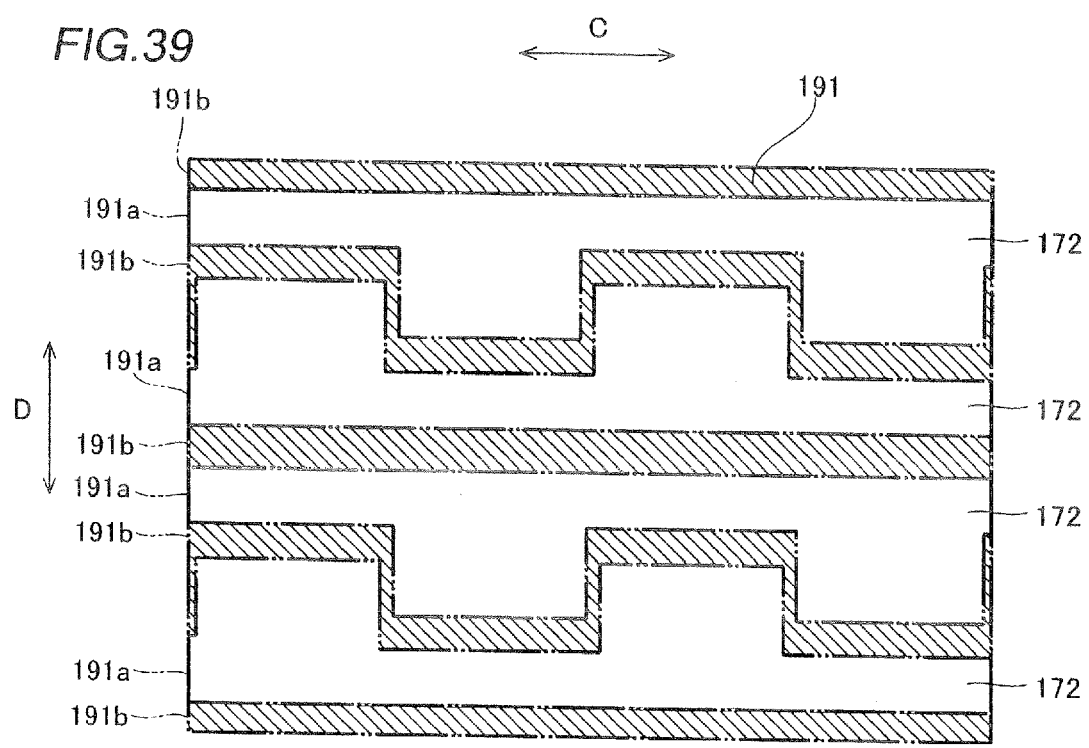
Figure 40:
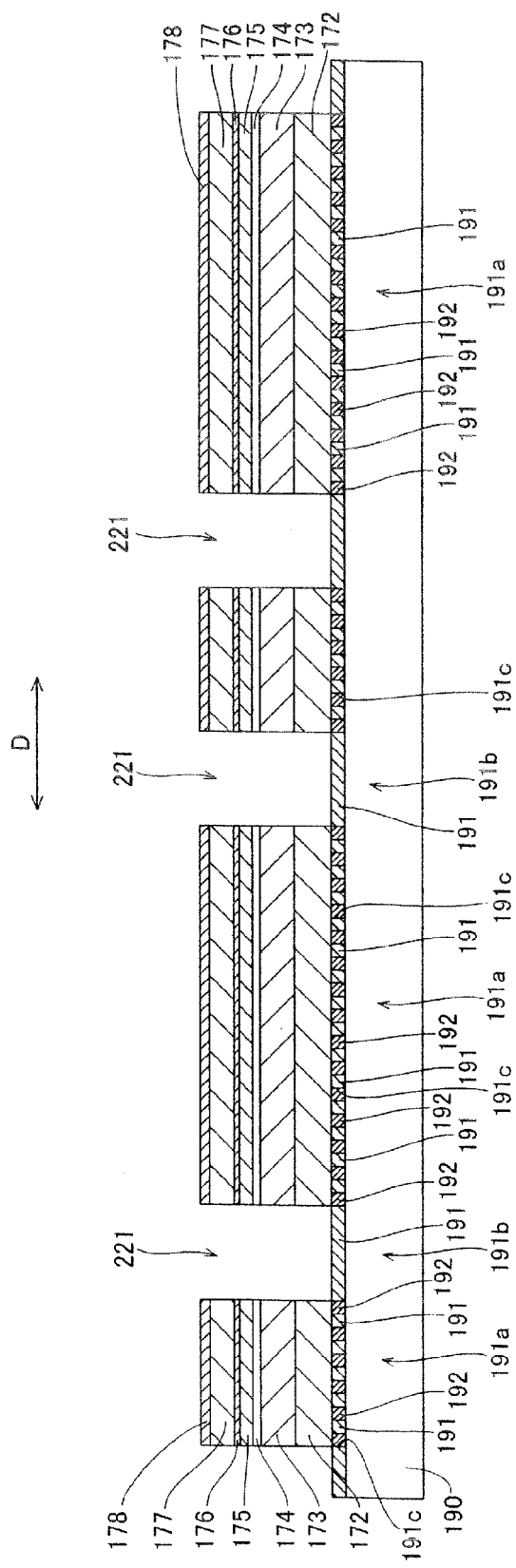
FIGS. 40 and 41 are sectional views for illustrating a process of fabricating the semiconductor laser diode according to the third embodiment shown in FIG. 36.

As shown in FIG. 40, a GaN buffer layer 192 is formed on the sapphire substrate 190 at a growth temperature of about 600° C. by MOVPE. The GaN buffer layer 192 is an example of a layer easily mechanically separated. At this time, the GaN buffer layer 192 is hardly formed on the selective growth mask 191 while being mainly formed on the openings 191c exposing the sapphire substrate 190. Then the n-type contact layers 172 are grown on the GaN buffer layers 192, whereby the n-type contact layers 172 are grown in a lateral direction and unite with each other, thereby forming the n-type contact layers 172 on the growth regions 191a as shown in FIG. 39.

Thereafter the layers from the n-type cladding layer 173 to the p-type contact layer 178 are grown under a condition where the layers are unlikely to be grown in the lateral direction, as shown in FIG. 40. In this case, the semiconductor layers are not grown on the isolation groove forming regions 191b of the selective growth mask 191 where no opening 191c is formed, while isolation grooves 221 are formed on the isolation groove forming regions 191b. According to the third embodiment, the semiconductor layers are grown on the growth substrate to be separated in the direction D thereby forming the isolation grooves 221, dissimilarly to the aforementioned first and second embodiments. More specifically, the isolation grooves 221 are formed not by etching but by selection growth.

Thereafter acceptor of the p-type nitride-based semiconductor layers are activated.

Figure 41:
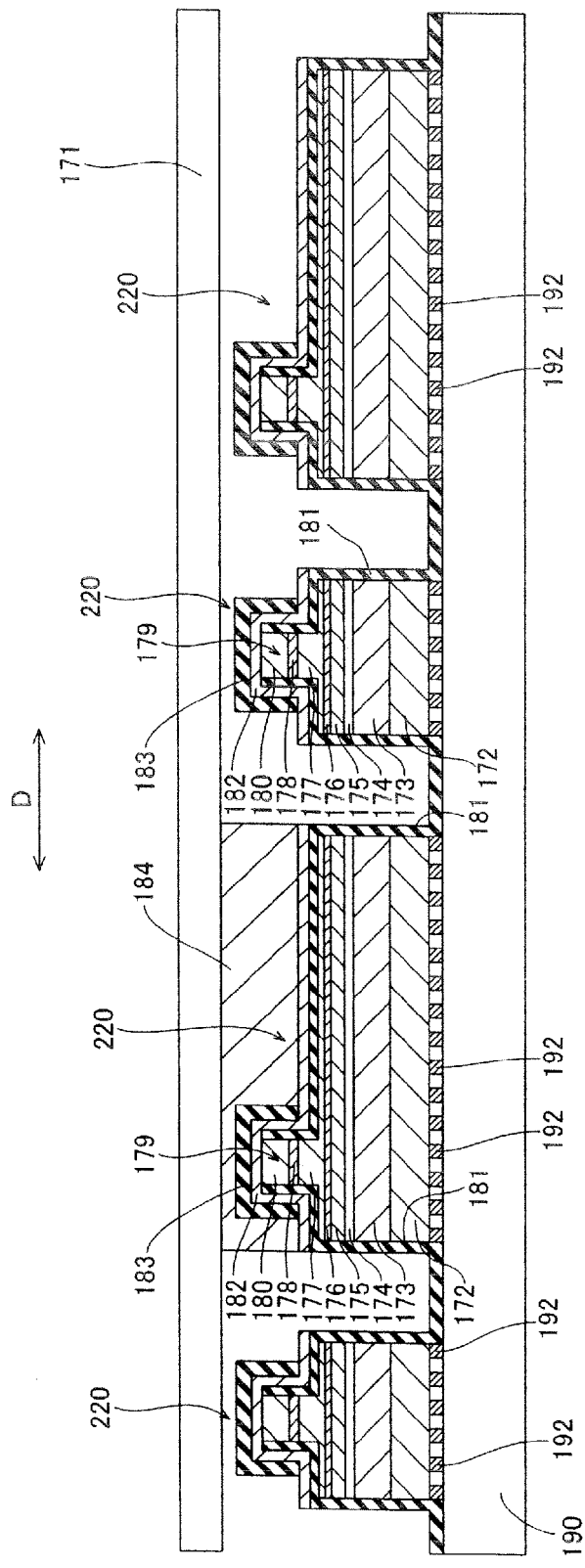

Thereafter the selective growth mask 191 is removed with hydrofluoric acid as shown in FIG. 41. Then the layers up to the insulating film 183 are removed through a process similar to that of the first embodiment. Thereafter the semiconductor laser diode portions 220 are bonded to the support substrate 171 through the adhesive layers 184 through a process similar to that of the first embodiment.

As shown in FIG. 37, the n-side ohmic electrodes 185 and the n-side pad electrodes 186 are formed so as to have the same multiplayer structure similar to that of the first embodiment. At this time, the n-side pad electrodes 186 are formed only on lower surfaces of the semiconductor laser diode portions 220 according to the third embodiment.

Some semiconductor laser diode portions 220 bonded to the support substrate 171 are separated from the GaN buffer layers 192. The GaN buffer layers 192 are each formed with a width of about 300 nm in a period of about 1 μm and hence the bond strength between the n-type contact layers 172 and the GaN buffer layers 192 is small as compared with the bond strength of from the n-type contact layers 172 to the p-type contact layers 178. Therefore, separation can be easily performed on interfaces between the n-type contact layers 172 and the GaN buffer layers 192.

Then the semiconductor laser diode according to the third embodiment shown in FIG. 36 is obtained by cleavage and device separation through a process similar to that of the first embodiment.

The remaining process of fabricating the semiconductor laser diode according to the third embodiment is similar to the process of fabricating the semiconductor laser diode according to the aforementioned first embodiment.

According to the third embodiment, as hereinabove described, the semiconductor laser diode portion 220 is so formed as to have the protruding portion 220a protruding in the direction D intersecting with the direction in which the cavity extends, whereby wire-bonding can be easily performed on the n-side pad electrode 186 of the protruding portion 220a also where the width of the W21 in the direction D of the semiconductor laser diode portion 220 except the protruding portion 220a is reduced. Therefore, the n-side pad electrode 186 is not required to be formed so as to extend on the surface of the support substrate 171 (lower surface) dissimilarly to the aforementioned first and second embodiments. Thus, the n-side pad electrode 186 can be easily formed.

The remaining effects of the third embodiment are similar to those of the aforementioned first embodiment.

Fourth Embodiment

Figure 42:
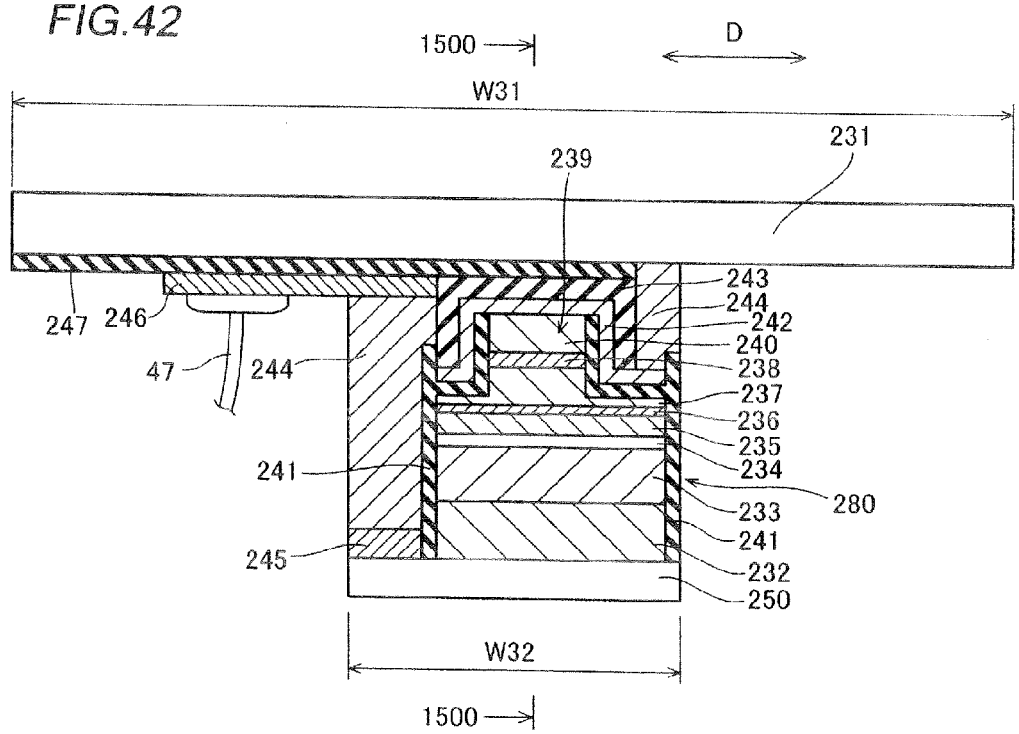
FIG. 42 is a sectional view showing a structure of a semiconductor laser diode according to a fourth embodiment of the present invention.

Referring to FIG. 42, a GaN substrate 250 employed as a growth substrate is arranged on a side farther from a support substrate 231 of a semiconductor laser diode portion 280 in a semiconductor laser diode according to a fourth embodiment, dissimilarly to the aforementioned first to third embodiments.

In the semiconductor laser diode according to the fourth embodiment, the support substrate 231 and the semiconductor laser diode portion 280 are bonded to each other through an adhesive layer 244 as shown in FIG. 42, similarly to the aforementioned first embodiment. The support substrate 231 is an example of the "second substrate" and the "substrate" in the present invention, and the semiconductor laser diode portion 280 is an example of the "first semiconductor laser diode portion" in the present invention A width (length) W31 in a direction D of the semiconductor laser diode (support substrate 231) is about 400 µm and a width (length) W32 in the direction D of the semiconductor laser diode portion 280 is about 40 µm.

According to the fourth embodiment, an n-type GaN substrate 250 having a thickness of about 80 µm employed as the growth substrate is arranged on the side farther from the support substrate 231 of the semiconductor laser diode portion 280 (lower surface side). The GaN substrate 250 is an example of the "first substrate" in the present invention. Then an n-type contact layer 232 is formed on a prescribed region of the GaN substrate 250.

An n-type cladding layer 233, a light-emitting layer 234, a p-type light guide layer 235, a p-type cap layer 236, a p-type cladding layer 237 and a p-type contact layer 238 are formed on the n-type contact layer 232, similarly to the aforementioned first embodiment. The projecting portion of the p-type cladding layer 237 and the p-type contact layer 238 constitute a ridge portion 239 employed as a current path. A p-side ohmic electrode 240 is formed on the p-type contact layer 238.

Insulating films 241 are formed on side surfaces of the n-type contact layer 232, the n-type cladding layer 233, the light-emitting layer 234, the p-type light guide layer 235, the p-type cap layer 236, the ridge portion 239 and the p-side ohmic electrode 240. A p-side pad electrode 242 and an insulating film 243 are formed on upper surfaces of the insulating films 241 and the p-side ohmic electrode 240, similarly to the first embodiment.

An n-side electrode 245 is formed on the surface (upper surface) of the n-type GaN substrate 250 where the layers from the n-type contact layer 232 to the p-type contact layer 238 are removed. Thus, the semiconductor laser diode portion 280 is constituted and the semiconductor laser diode portion 280 and the support substrate 231 are bonded to each other through the adhesive layer 244.

According to the fourth embodiment, the n-side electrode 245 is connected to an n-side pad electrode 246 formed on an insulating film 247 on the lower surface of the support substrate 231 through the adhesive layer 244. Thus, the n-side pad electrode 246 is electrically connected to the surface farther from the support substrate 231 of the semiconductor laser diode portion 280 (lower surface) according to the fourth embodiment. The n-side pad electrode 246 is an example of the "electrode layer" in the present invention.

The remaining structure of the semiconductor laser diode according to the fourth embodiment is similar to that of the aforementioned first embodiment.

A process of fabricating the semiconductor laser diode according to the fourth embodiment will be now described with reference to FIGS. 42 to 47.

Figure 43:
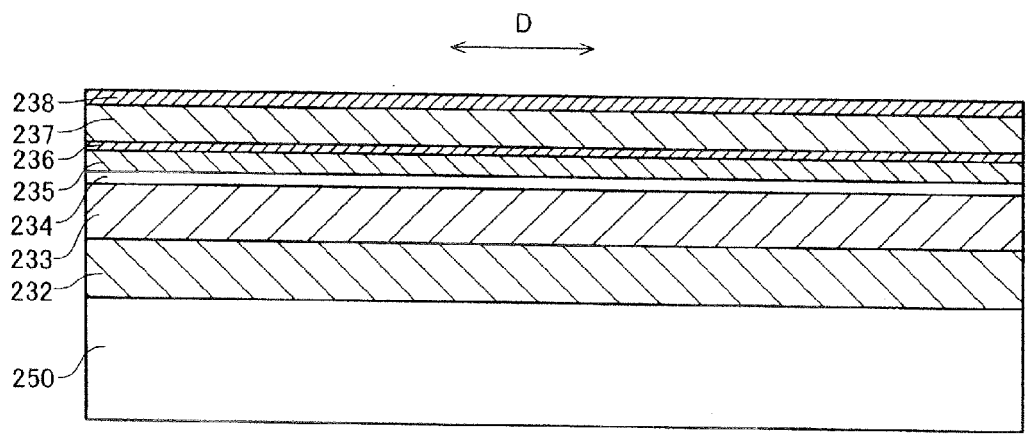
FIGS. 43 to 47 are sectional views for illustrating a process of fabricating the semiconductor laser diode according to the fourth embodiment shown in FIG. 42.

As shown in FIG. 43, the layers from the n-type contact layer 232 to the p-type contact layer 238 are successively grown on the n-type GaN substrate 250 having a thickness of about 400 µm, for example, through a process similar to that of the aforementioned first embodiment. Thereafter acceptor of a p-type nitride-based semiconductor layer is activated, thereby obtaining a prescribed concentration of holes.

Figure 44:
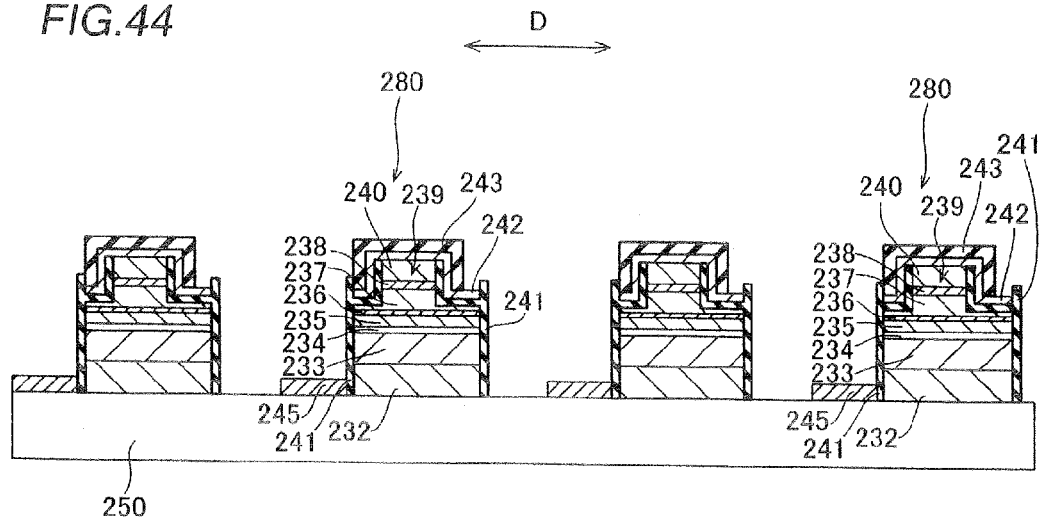

As shown in FIG. 44, the p-side ohmic electrodes 240 and the insulating films (not shown) are formed and the ridge portions 239 are formed in a period of about 100 µm through a process similar to that of the aforementioned first embodiment. Then the layers from the n-type contact layer 232 to the p-type contact layer 238 are etched by photolithography and dry-etching such that the layers including the ridge portions 239 remain with widths of about 40 µm, thereby exposing the surface of the GaN substrate 250. Thereafter the insulating films 241 made of $SiO_2$ each having a thickness of about 250 µm is so formed as to cover the side surfaces of the layers from the n-type contact layer 232 to the p-type cladding layer 237, the upper surface of planar portions of the p-type cladding layer 237, the side surface of the ridge portion 239 and the upper surface of the insulating film (not shown) through a process similarly to the aforementioned first embodiment, and thereafter only the insulating films 241 on the p-side ohmic electrodes 240 are removed. Then the p-side pad electrodes 242 are formed on the p-side ohmic electrodes 240 and the insulating films 241 similarly to the aforementioned first embodiment.

Thereafter the n-side electrodes 245 made of Al having a thickness of about 10 nm, Ti having a thickness of about 20 nm, Pt having a thickness of about 20 nm and Au having a thickness of about 300 nm from the side closer to the GaN substrate 250 are formed on the prescribed regions of surfaces where the GaN substrate 250 is exposed. Then insulating films 243 made of $SiO_2$ each having a thickness of about 100 nm are formed on the p-side pad electrodes 242.

Figure 45:
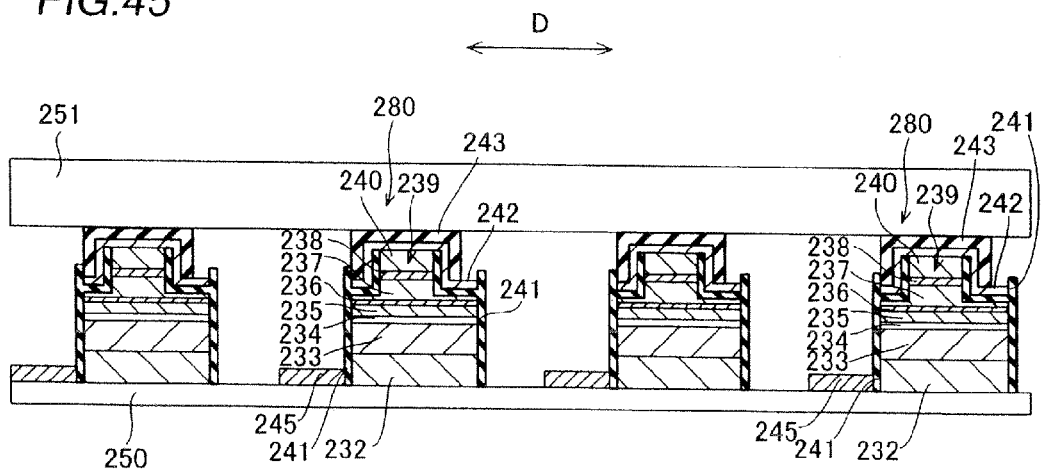

According to the fourth embodiment, a provisional support substrate 251 is thereafter bonded to the semiconductor laser diode portions 280 as shown in FIG. 45. A thermal release sheet formed with a thermal release adhesive material on one side of a film such as polyester is employed as the provisional support substrate 251 for example, and the semiconductor laser diode portions 280 are bonded onto a side of the film, on which the thermal release adhesive material is formed. Thereafter the back surface (lower surface) of the GaN substrate 250 is mechanically polished and chemically mechanically polished, so that the GaN substrate 250 has a thickness of about 80 µm.

Figure 46:
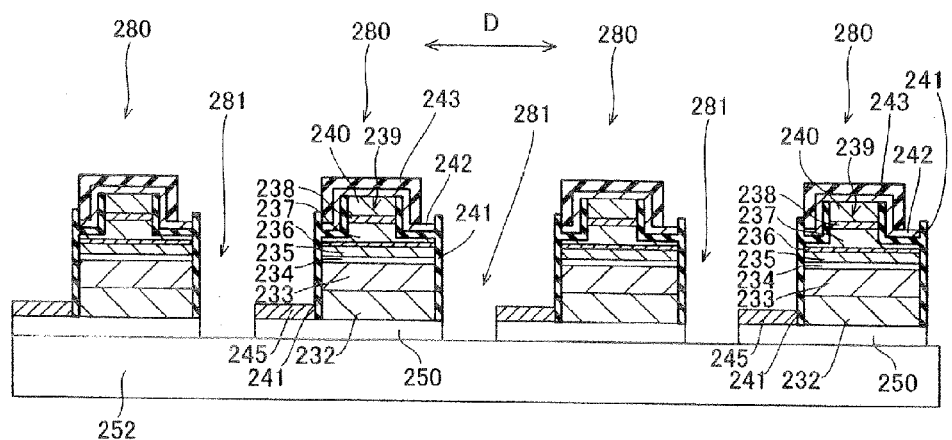

According to the fourth embodiment, a provisional support substrate 252 is bonded onto a lower surface of the GaN substrate 250 as shown in FIG. 46 and thereafter heat is applied to the provisional support substrate 251 (see FIG. 45) to peel the provisional support substrate 251, thereby forming a structure shown in FIG. 46. According to the fourth embodiment, a thermal release sheet is employed as the provisional support substrate 252. The thermal release adhesive material is selected such that a release temperature of the thermal release sheet employed as the provisional support substrate 252 is higher than that of the thermal release sheet employed as the provisional support substrate 251. Thereafter the GaN substrate 250 formed with the semiconductor laser diode portions 280 is diced, thereby forming isolation grooves 281. The support substrate 252 is an example of the "third substrates" in the present invention.

Figure 47:
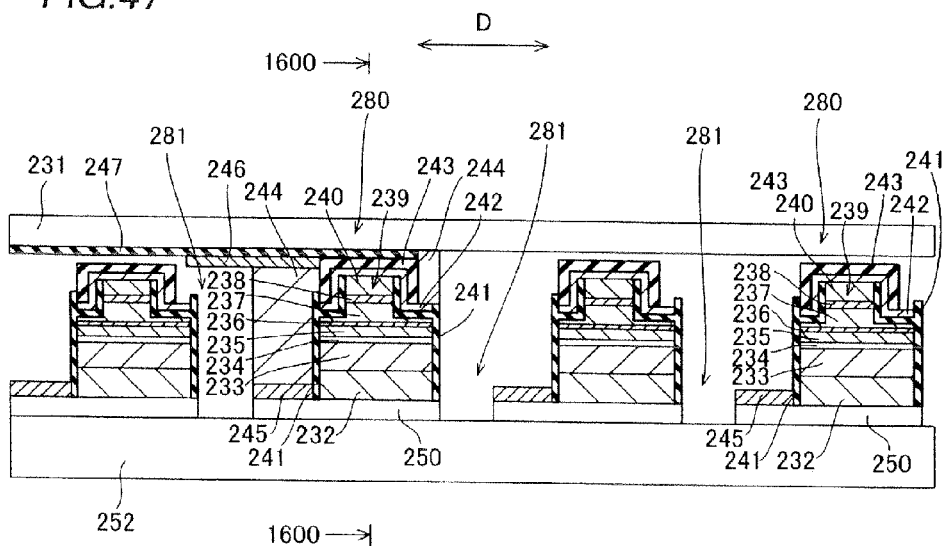

Thereafter some of the semiconductor laser diode portions 280 are bonded to the support substrate 231 through the adhesive layers 244 as shown in FIG. 47. The n-side pad electrodes 246 are previously formed on a lower surface of the support substrate 231 through the insulating films 247. At this time, the n-side pad electrodes 246 and the support substrate 231 are bonded to each other such that the p-side pad electrodes 242 are electrically connected to the support substrate 231 and the n-side electrodes 245 are electrically connected to the n-side pad electrodes 246. Thereafter some of the semiconductor laser diode portions 280 and the GaN substrates 250 are separated from the provisional support substrate 252. Then steps from a step of bonding some of the semiconductor laser diode portions 280 to the support substrate 231 to a step of separating the some of the semiconductor laser diode portions 280 from the provisional support substrate 252 are repeated four times, thereby obtaining four support substrates 231 having the semiconductor laser diode portions 280.

Then the semiconductor laser diode according to the fourth embodiment shown in FIG. 42 is obtained by cleavage and device separation through a process similar to that according to the first embodiment.

The remaining process of fabricating the semiconductor laser diode according to the fourth embodiment is similar to the process of fabricating the semiconductor laser diode according to the aforementioned first embodiment.

According to the fourth embodiment, as hereinabove described, the method of fabricating the semiconductor laser diode comprises the step of forming a plurality of the semiconductor laser diode portions 280 on the GaN substrate 250, thereafter arranging the GaN substrate 250 formed with the plurality of semiconductor laser diode portions 280 at prescribed intervals in the direction D on the provisional support substrate 252 and isolating the GaN substrate 250, and the step of bonding some of the plurality of semiconductor laser diode portions 280 to the support substrate 231 and peeling some of the plurality of semiconductor laser diode portions 280 and the isolated GaN substrates 250 from the support substrate 252, whereby the semiconductor laser diode portions 280 can be fixed to the support substrate 231 without peeling the same from the GaN substrates 250. Thus, the semiconductor laser diode portions 280 can be easily fixed to the support substrate 231 without damage of the semiconductor laser diode portions 280 due to peeling of the semiconductor laser diode portions 280 from the GaN substrates 250, in a case where the semiconductor laser diode portions 280 are difficult to be separated from the GaN substrates 250.

The remaining effects of the fourth embodiment are similar to those of the aforementioned first embodiment.

Modification of Fourth Embodiment

Figure 48:
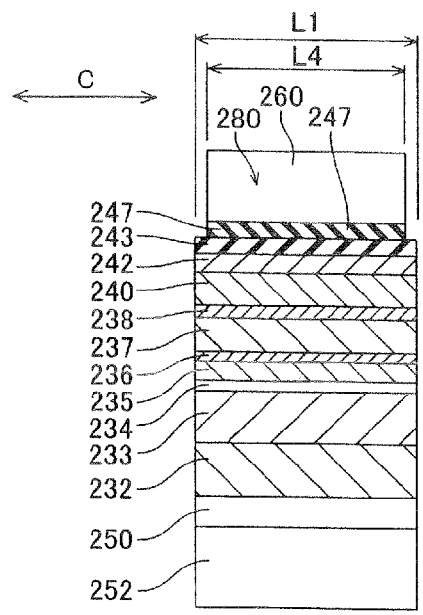
FIG. 48 is a sectional view showing a sectional structure in a direction C of a semiconductor laser diode according to a modification of the fourth embodiment of the present invention.
Figure 49:
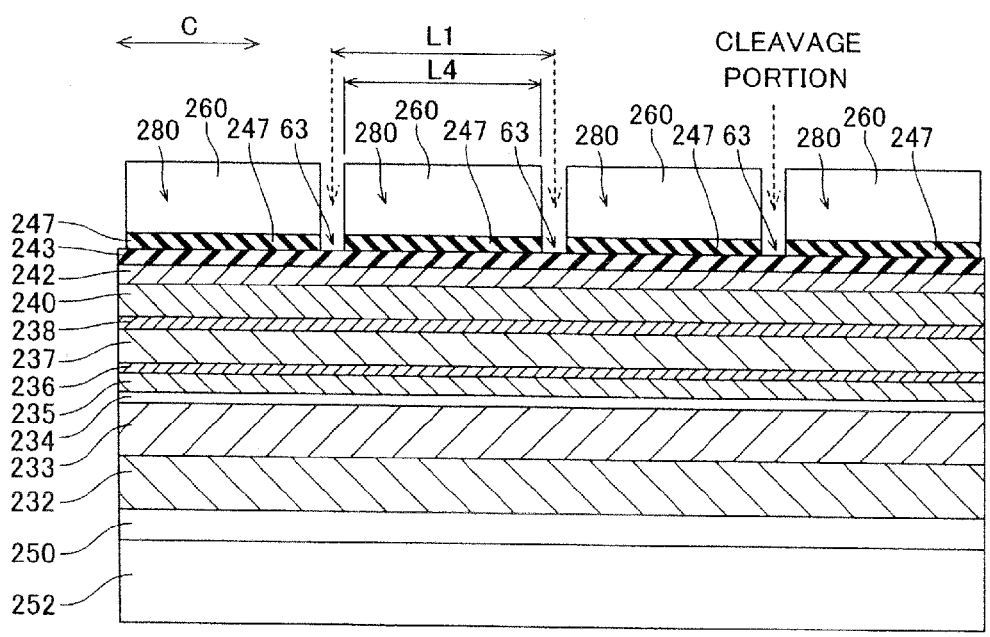
FIG. 49 is a sectional view in the direction C for illustrating a process of fabricating the semiconductor laser diode according to the modification of the fourth embodiment shown in FIG. 48.

Referring to FIGS. 48 and 49, support substrates 260 each previously formed in the form of a bar (strip) extending in a direction D are bonded to semiconductor laser diode portions 280 through adhesive layers 244 in a process of fabricating a semiconductor laser diode according to a modification of the fourth embodiment, dissimilarly to the aforementioned fourth embodiment. The support substrate 260 is an example of the "substrate" and the "second substrate" in the present invention. A sectional structure in the direction D of the semiconductor laser diode according to this modification is similar to that of the semiconductor laser diode in FIG. 42, and FIG. 48 shows a cross section taken along the line 1500-1500 in FIG. 42. FIG. 49 is a cross section taken along the line 1600-1600 in FIG. 47.

The semiconductor laser diode according to the modification of the fourth embodiment is constituted by the semiconductor laser diode portion 280 having a length (cavity plane length) L1 of about 600 μm and the support substrate 260 having a width (length) L4 of about 560 μm in a direction C, as shown in FIG. 48.

In the process of fabricating the semiconductor laser diode according to the modification of the fourth embodiment, a plurality of the support substrates 260 each previously formed in the form of a bar (strip) having the width L4 in the direction C, are bonded to the semiconductor laser diode portions 280 through the adhesive layers 244 while being arranged in substantially parallel to each other at prescribed intervals of about 40 μm in the direction C, as shown in FIG. 49. Thus, regions 63 where no support substrate 260 is bonded are formed between the adjacent support substrates 260. Thus, cleavage positions (dotted arrows) are fit to the regions 63 when cleavage (bar cleavage) is performed so as to have the (1-100) planes of the semiconductor laser diode portions 280 after peeling the provisional support substrate 252 from the semiconductor laser diode portions 280, whereby only the semiconductor laser diode portions 280 are cleaved without cleaving the support substrates 260 and hence the yield can be improved.

The remaining structure of the semiconductor laser diode according to the modification of the fourth embodiment and the remaining process of fabricating the same are similar to those of the semiconductor laser diode according to the aforementioned fourth embodiment. The remaining effects of the modification of the fourth embodiment are also similar to those of the aforementioned fourth embodiment.

Fifth Embodiment

Referring to FIGS. 19 and 50 to 53, in a three-wavelength semiconductor laser diode according to a fifth embodiment, a blue-violet semiconductor laser diode 320 having a device structure similar to the structure of the aforementioned first embodiment is bonded to a monolithic two-wavelength semiconductor laser diode in which a red semiconductor laser diode 300 and an infrared semiconductor laser diode 310 are formed on an n-type GaAs substrate 350, in replace of the support substrate 31 (see FIG. 19), thereby forming a three-wavelength semiconductor laser diode, dissimilarly to the aforementioned first embodiment. The n-type GaAs substrate 350 is an example of the "second substrate" and the "substrate" in the present invention. The red semiconductor laser diode 300 and the infrared semiconductor laser diode 310 are examples of the "second semiconductor laser diode portion" in the present invention and the blue-violet semiconductor laser diode 320 is an example of the "first semiconductor laser diode portion" in the present invention.

Figure 50:
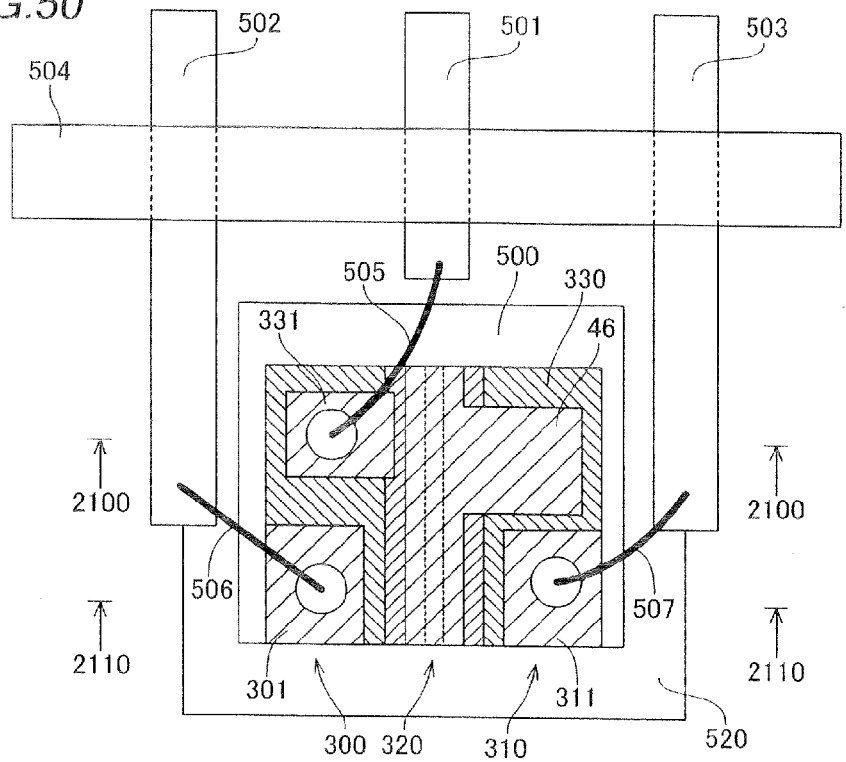
FIG. 50 is a bottom plan view of a structure of a semiconductor laser apparatus comprising a three-wavelength semiconductor laser diode according to a fifth embodiment of the present invention.

In a semiconductor laser apparatus according to the fifth embodiment, the three-wavelength semiconductor laser diode is fixed to a base 500 made of AlN through an adhesive layer (not shown) made of a metal layer such as AuSn solder, as shown in FIG. 50. The base 500 is fixed to a stem 504 through which three lead terminals 501, 502 and 503 pass, through a pedestal 520.

Figure 51:
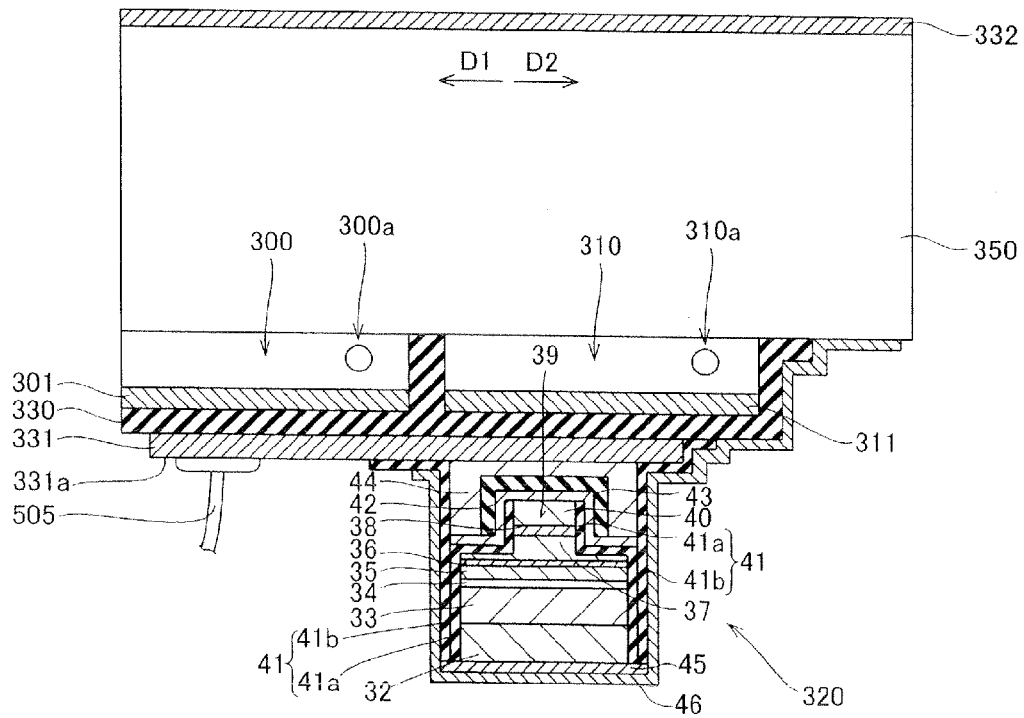
FIG. 51 is a sectional view taken along the line 2100-2100, of the three-wavelength semiconductor laser diode shown in FIG. 50.

According to the fifth embodiment, the three-wavelength semiconductor laser diode has a structure in which the blue-violet semiconductor laser diode 320 having an oscillation wavelength of about 405 nm is bonded to the monolithic two-wavelength semiconductor laser diode in which the red semiconductor laser diode 300 having an oscillation wavelength of about 650 nm and the infrared semiconductor laser diode 310 having an oscillation wavelength of about 780 nm are formed on the n-type GaAs substrate 350 through the adhesive layer 44, as shown in FIG. 51.

More specifically, the blue-violet semiconductor laser diode 320 is bonded to a lower surface of the monolithic two-wavelength semiconductor laser diode through an insulating film 330 made of $SiO_2$ formed on the lower surface of the monolithic two-wavelength semiconductor laser diode and a p-side pad electrode 331 formed on the insulating film 330, as shown in FIG. 51. As shown in FIGS. 50 and 51, the blue-violet semiconductor laser diode 320 has a protruding portion 331a where the p-side pad electrode 331 extends in a direction D1, and is connected to the lead terminal 501 (see FIG. 50) through a metal wire 505 wire-bonded on a surface of the protruding portion 331a.

As shown in FIG. 51, an n-side pad electrode 46 of the blue-violet semiconductor laser diode 320 extends in a direction D2 so as to cover the insulating film 330 of the monolithic two-wavelength semiconductor laser diode, and is connected to the lower surface of the n-type GaAs substrate 350 of the monolithic two-wavelength semiconductor laser diode to be rendered conductive.

Figure 52:
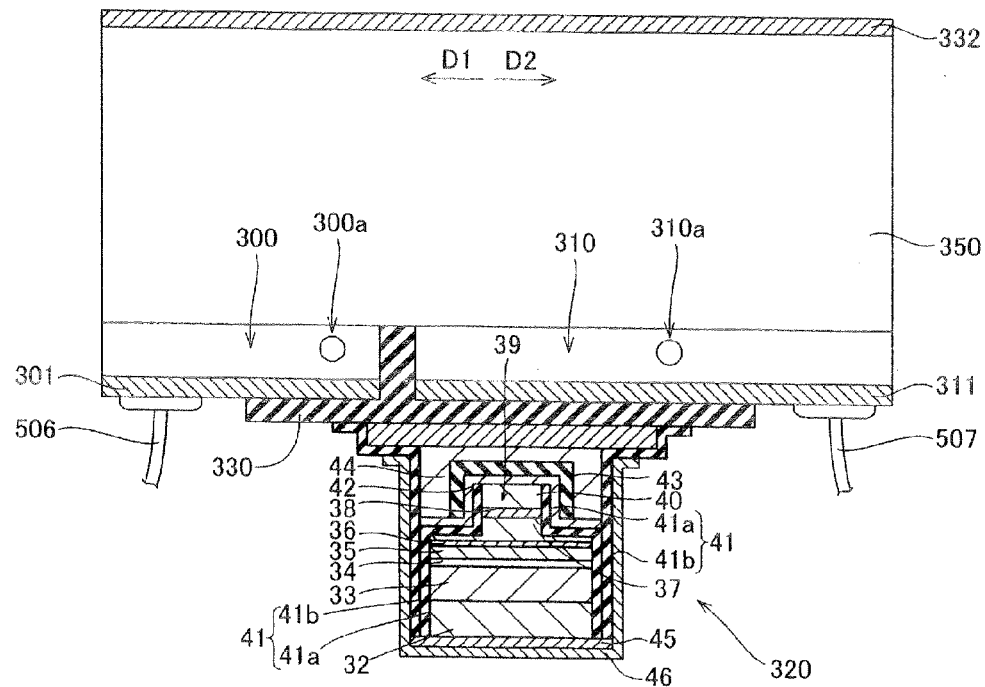
FIG. 52 is a sectional view taken along the line 2110-2110, of the three-wavelength semiconductor laser diode shown in FIG. 50.

As shown in FIGS. 50 and 52, the red semiconductor laser diode 300 is connected to the lead terminal 502 (see FIG. 50) through a metal wire 506 wire-bonded on a surface of a p-side pad electrode 301 formed on the red semiconductor laser diode 300 of the monolithic two-wavelength semiconductor laser diode. The infrared semiconductor laser diode 310 is connected to the lead terminal 503 (see FIG. 50) through a metal wire 507 wire-bonded on a surface of a p-side pad electrode 311 formed on the infrared semiconductor laser diode 310 of the monolithic two-wavelength semiconductor laser diode.

Figure 53:
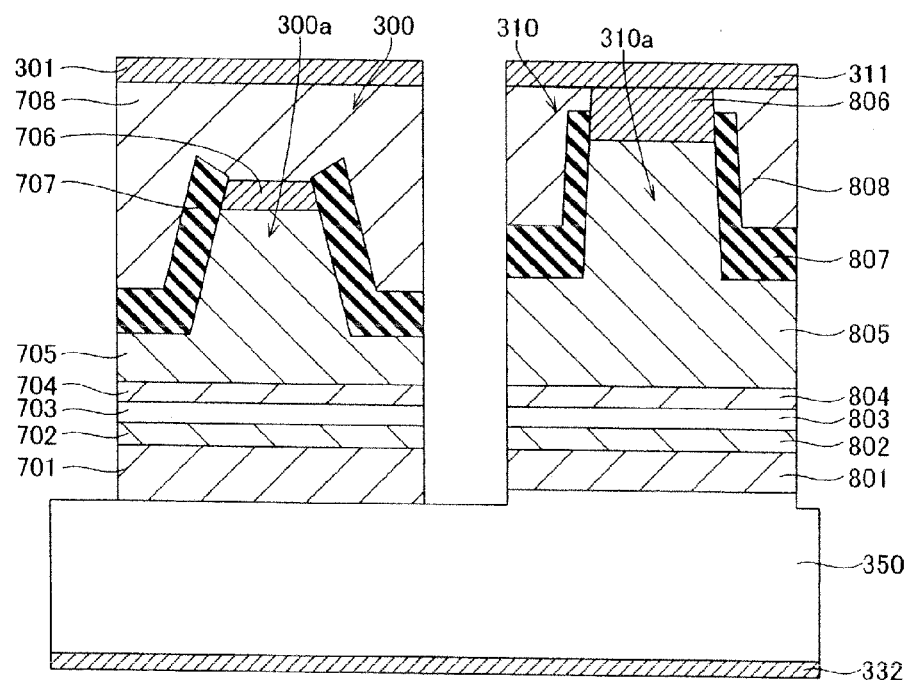
FIG. 53 is a sectional view showing a detailed structure of the three-wavelength semiconductor laser diode shown in FIG. 50.

As shown in FIG. 53, in the monolithic two-wavelength semiconductor laser diode, the red semiconductor laser diode 300 having an AlGaInP-based multilayer structure and the infrared semiconductor laser diode 310 having an AlGaAs-based multilayer structure are so formed on a principal surface of the n-type GaAs substrate 350 as to be spaced from each other.

More specifically, the red semiconductor laser diode 300 is formed by successively forming an n-type cladding layer 701, a light guide layer 702, an active layer 703 constituted by three well layers and two barrier layers, a light guide layer 704, a p-type cladding layer 705 and a contact layer 706 on the n-type GaAs substrate 350 doped with Si through crystal growth. A current blocking layer 707 made of $SiO_2$ is so formed as to cover planar portions and side surfaces of the projecting p-type cladding layer 705 and side surfaces of the contact layer 706. A projecting portion of the p-type cladding layer 705 constitutes a ridge portion 300a extending in a cavity direction in the form of a stripe as a light waveguide of the red semiconductor laser diode 300. Then a contact layer 708 is formed on the current blocking layer 707 and the contact layer 706 and the p-side pad electrode 301 is formed on the contact layer 708.

The infrared semiconductor laser diode 310 is formed by successively forming an n-type cladding layer 801, a light guide layer 802, an active layer 803 constituted by three well layers and two barrier layers, a light guide layer 804, a p-type cladding layer 805 and a contact layer 806 on the n-type GaAs substrate 350 through crystal growth. A current blocking layer 807 made of $SiO_2$ is so formed as to cover planar portions and side surfaces of the projecting p-type cladding layer 805 and a part of side surfaces of the contact layer 806. A projecting portion of the p-type cladding layer 805 constitutes a ridge portion 310a extending in a cavity direction in the form of a stripe as a light waveguide of the infrared semiconductor laser diode 310. Then a cap layer 808 is formed on the current blocking layer 807 and the contact layer 806 and the p-side pad electrode 311 is formed on the contact layer 806 and the cap layer 808.

As shown in FIG. 53, an n-side electrode 332 is formed on a lower surface of the n-type GaAs substrate 350 of the monolithic two-wavelength semiconductor laser diode.

As shown in FIGS. 51 and 52, the insulating film 330 is so formed as to cover a groove formed between the respective semiconductor laser diodes of the monolithic two-wavelength semiconductor laser diode and the upper surfaces of the p-side pad electrodes 301 and 311 of the respective semiconductor laser diodes. Thus, in the three-wavelength semiconductor laser diode, anodes of the three semiconductor laser diodes are insulated from each other with the insulating film 330 and the three semiconductor laser diodes are fixed to the base 500 while employing the n-side electrode 332 as a common electrode on cathode sides.

In the process of fabricating the three-wavelength semiconductor laser diode according to the fifth embodiment, as hereinabove described, one of the plurality of blue-violet semiconductor laser diodes 320 formed through a fabricating process similar to that of the aforementioned first embodiment is bonded to the monolithic two-wavelength semiconductor laser diode in place of the support substrate 31 (see FIG. 19) employed in the aforementioned first embodiment, whereby the semiconductor laser diode having a multiple wavelength (three wavelengths) can be easily formed.

According to a fifth embodiment, both of the red semiconductor laser diode 300 and the infrared semiconductor laser diode 310 are formed on the n-type GaAs substrate 350 by crystal growth, whereby the monolithic two-wavelength semiconductor laser diode can be formed so as to have a desired size and hence can easily be bonded to the blue-violet semiconductor laser diode 320 for forming the three-wavelength semiconductor laser diode.

Sixth Embodiment

Referring to FIGS. 19 and 54 to 56, in a RGB three-wavelength semiconductor laser diode according to a sixth embodiment, a blue semiconductor laser diode 400 and a green semiconductor laser diode 410 each having a device structure similar to the structure of the aforementioned first embodiment are bonded to a red semiconductor laser diode 300 formed on an n-type GaAs substrate 350, in replace of the support substrate 31 (see FIG. 19), thereby forming a RGB wavelength semiconductor laser diode, dissimilarly to the aforementioned first embodiment. The blue semiconductor laser diode 400 and the green semiconductor laser diode 410 are examples of the "first semiconductor laser diode portion" in the present invention.

Figure 54:
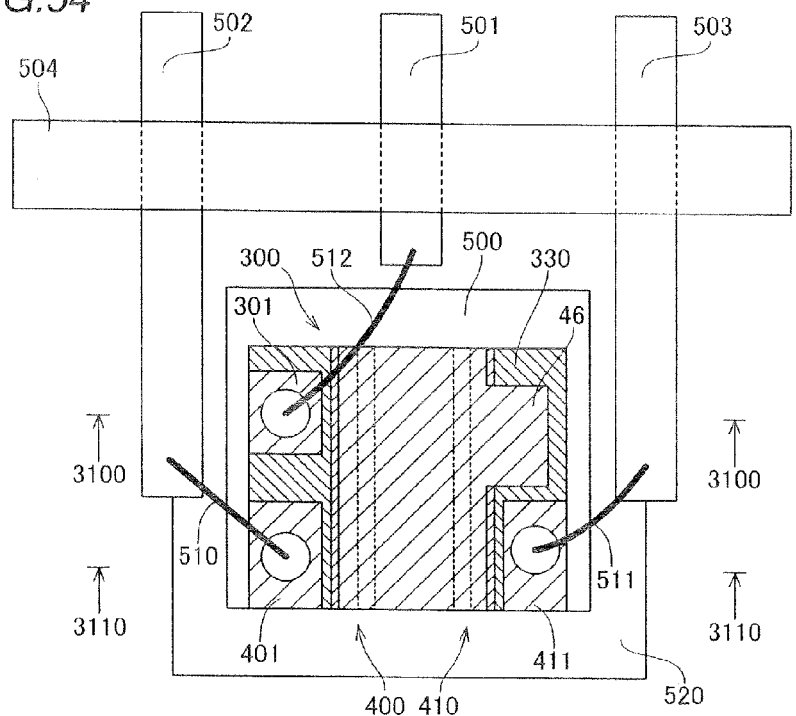
FIG. 54 is a bottom plan view of a structure of a semiconductor laser apparatus comprising a RGB three-wavelength semiconductor laser diode according to a sixth embodiment of the present invention.

In a semiconductor laser apparatus according to the sixth embodiment, the RGB three-wavelength semiconductor laser diode is fixed to a base 500 made of AlN through an adhesive layer (not shown) made of a metal layer such as AuSn solder, as shown in FIG. 54. The base 500 is fixed to a stem 504 through which three lead terminals 501, 502 and 503 pass through a pedestal 505.

Figure 55:
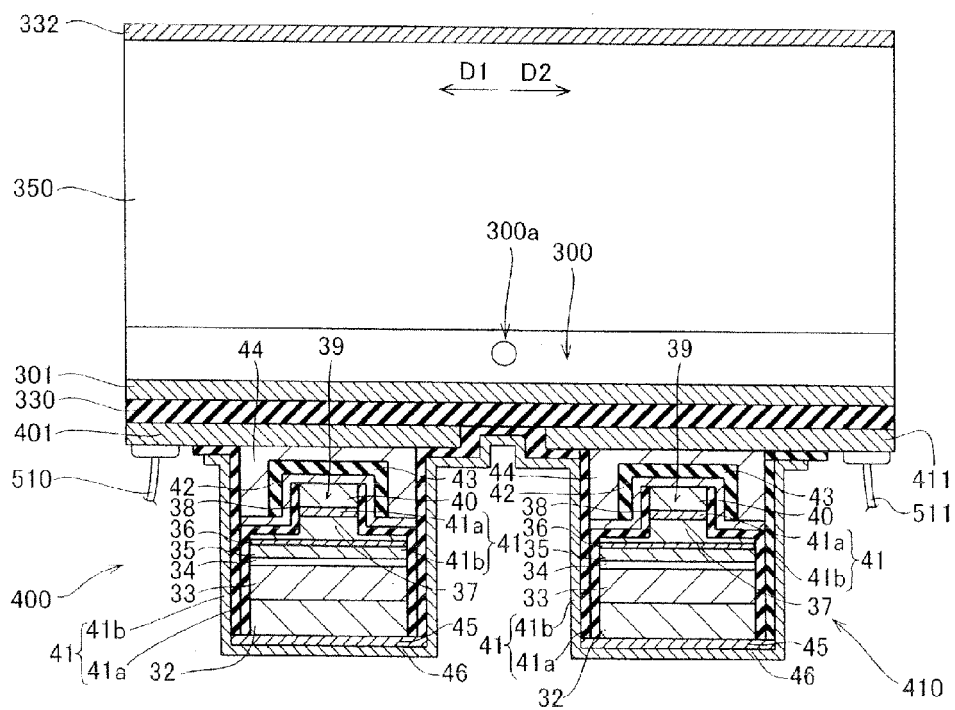
FIG. 55 is a sectional view taken along the line 3100-3100, of the RGB three-wavelength semiconductor laser diode shown in FIG. 54.

According to the sixth embodiment, the RGB three-wavelength semiconductor laser diode has a structure in which the blue semiconductor laser diode 400 having an oscillation wavelength of about 460 nm and the green semiconductor laser diode 410 having an oscillation wavelength of about 530 nm are bonded to the red semiconductor laser diode 300 having an oscillation wavelength of about 650 nm formed on the n-type GaAs substrate 350 through the adhesive layers 44, as shown in FIG. 55.

More specifically, the blue semiconductor laser diode 400 and the green semiconductor laser diode 410 are bonded to a lower surface of the red semiconductor laser diode 300 through an insulating film 330 made of SiO$_2$ formed on the lower surface of the red semiconductor laser diode 300 and p-side pad electrodes 401 and 411 formed on the insulating film 330 respectively, as shown in FIG. 55. As shown in FIGS. 54 and 55, the blue semiconductor laser diode 400 is connected to the lead terminal 502 (see FIG. 54) through a metal wire 510 wire-bonded on a surface of an end in a direction D1 of a p-side pad electrode 401. The green semiconductor laser diode 410 is connected to the lead terminal 503 (see FIG. 54) through a metal wire 511 wire-bonded on a surface of an end in a direction D2 of a p-side pad electrode 411.

Figures 56, 57:
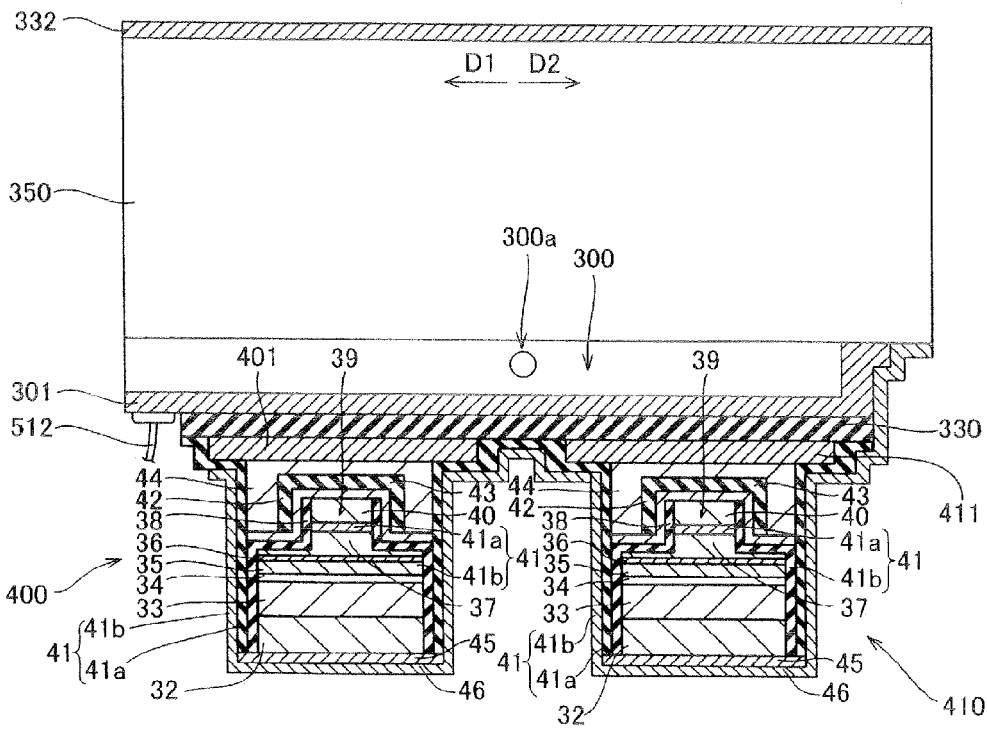
FIG. 56 is a sectional view taken along the line 3110-3110, of the RGB three-wavelength semiconductor laser diode shown in FIG. 54.
FIGS. 57 and 58 are sectional views for illustrating a process of fabricating the RGB three-wavelength semiconductor laser diode according to the sixth embodiment of the present invention.

As shown in FIG. 56, an n-side pad electrode 46 formed so as to cover both of the blue semiconductor laser diode 400 and the green semiconductor laser diode 410 extends in the direction D2 so as to cover the insulating film 330 of the red semiconductor laser diode 300, and is connected to the lower surface of the n-type GaAs substrate 350 of the red semiconductor laser diode 300 to be rendered conductive.

As shown in FIGS. 54 and 56, the red semiconductor laser diode 300 is connected to the lead terminal 501 (see FIG. 54) through a metal wire 512 wire-bonded on a surface of a p-side pad electrode 301 formed on the red semiconductor laser diode 300.

According to the sixth embodiment, an MQW active layer (not shown) constituting the light-emitting layer 34 (see FIG. 56) MQW is formed by alternately stacking four barrier layers made of undoped In$_{0.02}$Ga$_{0.98}$N each having a thickness of about 20 nm and three quantum well layers made of undoped In$_{0.25}$Ga$_{0.75}$N each having a thickness of about 3 nm, in the blue semiconductor laser diode 400. In the green semiconductor laser diode 410, an MQW active layer (not shown) constituting the light-emitting layer 34 (see FIG. 56) MQW is formed by alternately stacking four barrier layers made of undoped In$_{0.02}$Ga$_{0.98}$N each having a thickness of about 20 nm and three quantum well layers made of undoped In$_{0.35}$Ga$_{0.65}$N each having a thickness of about 3 nm.

Figure 58:
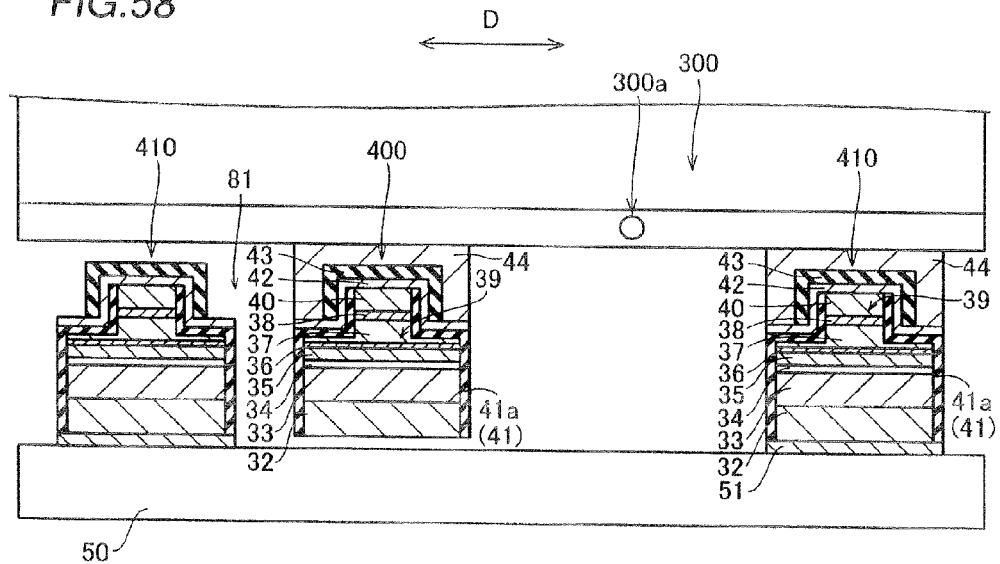

Referring to FIGS. 54 and 56 to 58, in the process of fabricating the RGB three-wavelength semiconductor laser diode according to the sixth embodiment, one of the plurality of blue semiconductor laser diodes 400 formed through a fabricating process similar to that of the aforementioned first embodiment is first bonded to the red semiconductor laser diode 300 in place of the support substrate 31 (see FIG. 19) employed in the aforementioned first embodiment, as shown in FIG. 57. Then the blue semiconductor laser diode 400 is separated from the GaN substrate 50 and thereafter one of the plurality of green semiconductor laser diodes 410 formed through the fabricating process similar to that of the aforementioned first embodiment is bonded as shown in FIG. 58. At this time, the green semiconductor laser diode 410 is bonded at a prescribed interval in the direction D (see FIG. 56) from the blue semiconductor laser diode 400.

Then the separative layer 51 is removed by laser beam irradiation and thereafter an outer portion 41b of an insulating film 41 is so formed as to cover outer surfaces of the blue semiconductor laser diode 400 and the green semiconductor laser diode 410 as shown in FIG. 56. Thereafter n-side ohmic electrodes 45 are formed and the n-side pad electrode 46 is so formed as to extend on from the n-side ohmic electrodes 45 to the n-type GaAs substrate 350 (support substrate).

The remaining process of fabricating the semiconductor laser diode according to the sixth embodiment is similar to the process of fabricating the semiconductor laser diode according to the aforementioned fifth embodiment. The remaining effects of the sixth embodiment are also similar to those of the aforementioned fifth embodiment.

Modification of Sixth Embodiment

Figure 59:
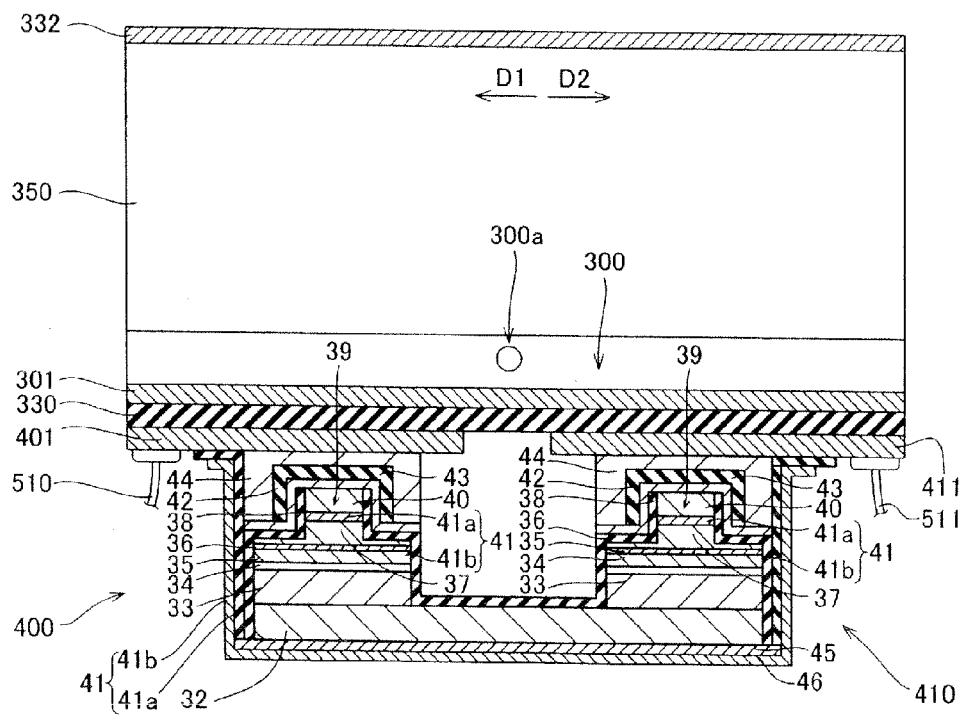
FIG. 59 is a sectional view showing a structure of a RGB three-wavelength semiconductor laser diode according to a modification of the sixth embodiment of the present invention.

Referring to FIG. 59, in a RGB three-wavelength semiconductor laser diode according to a modification of the sixth embodiment, a monolithic two-wavelength semiconductor laser diode constituted by a blue semiconductor laser diode 400 and a green semiconductor laser diode 410 is bonded to a red semiconductor laser diode 300 formed on an n-type GaAs substrate 350, thereby forming a RGB wavelength semiconductor laser diode, dissimilarly to the aforementioned sixth embodiment.

According to the modification of the sixth embodiment, the RGB three-wavelength semiconductor laser diode has a structure in which the monolithic two-wavelength semiconductor laser diode constituted by the blue semiconductor laser diode 400 and the green semiconductor laser diode 410 is bonded to the red semiconductor laser diode 300 through adhesive layers, as shown in FIG. 59.

In other words, in the process of fabricating the RGB three-wavelength semiconductor laser diode according to the modification of the sixth embodiment, the blue semiconductor laser diode 400 and the green semiconductor laser diode 410 are formed on the same growth substrate (not shown) at a prescribed interval in a direction D, thereby forming the monolithic two-wavelength semiconductor laser diode, as shown in FIG. 59. Then the monolithic two-wavelength semiconductor laser diode is bonded to the red semiconductor laser diode 300 through the adhesive layers 44.

The separative layer 51 is removed by laser beam irradiation and thereafter an outer portion 41b of an insulating film 41 is so formed as to cover outer side surfaces of the blue semiconductor laser diode 400 and the green semiconductor laser diode 410 as shown in FIG. 59. Thereafter an n-side ohmic electrode 45 is formed and the n-side pad electrode 46 is so formed as to extend on from the n-side ohmic electrode 45 to the support substrate 31.

The remaining process of fabricating the semiconductor laser diode according to the modification of the sixth embodiment is similar to the process of fabricating the semiconductor laser diode according to the aforementioned sixth embodiment. The remaining effects of the modification of the sixth embodiment are also similar to those of the aforementioned fifth embodiment.

Although the present invention has been described and illustrated in detail, it is clearly understood that the same is by way of illustration and example only and is not to be taken by way of limitation, the spirit and scope of the present invention being limited only by the terms of the appended claims.

While a prescribed number of the semiconductor laser diode portions are bonded onto the support substrate in each of the aforementioned first to sixth embodiments, the present invention is not restricted to this but one semiconductor laser diode may be alternatively bonded onto one support substrate, for example.

While the cavity planes of the semiconductor laser diode portion are formed outside with respect to the end surfaces in the direction C of the support substrate in each of the aforementioned first to sixth embodiments, the present invention is not restricted to this but the cavity planes of the semiconductor laser diode portion may be so formed as to coincide with the end surfaces in the direction C of the support substrate, or the cavity planes of the semiconductor laser diode portion may be formed inside with respect to the end surfaces in the direction C of the support substrate.

What is claimed is:

1. A semiconductor laser diode apparatus comprising:
a substrate;
a first semiconductor laser diode portion having a cavity, formed on a surface of said substrate; and
an electrode layer electrically connected to a first surface of said first semiconductor laser diode portion, wherein
said cavity extends in a first direction,
said first direction is parallel to said surface of said substrate,
a second surface of said first semiconductor laser diode portion is opposite to said first surface, and said second surface is bonded to said substrate through a conductive adhesive layer,
a length in a second direction of said substrate is larger than a length in said second direction of said first semiconductor laser diode portion,
said second direction is parallel to said surface of said substrate,
said second direction intersects with said first direction,
said electrode layer is formed on both said first surface and an adjacent surface of said substrate to said first semiconductor laser diode portion in said second direction,
said electrode layer extends in said second direction from said first surface to said adjacent surface of said substrate,
an insulating film is formed between said electrode layer and said conductive adhesive layer,
a metal wire is wire-bonded onto said electrode layer, and
a wire-bonded portion of said metal wire is positioned over said adjacent surface of said substrate.

2. The semiconductor laser diode apparatus according to claim 1, wherein
said length in said second direction of said substrate is at least twice said length in said second direction of said first semiconductor laser diode portion.

3. A semiconductor laser diode apparatus comprising:
a substrate;
a first semiconductor laser diode portion having a cavity, formed on a surface of said substrate; and
an electrode layer formed on a first surface of said first semiconductor laser diode portion, and said first surface of said first semiconductor laser diode portion is opposite to a second surface of said first semiconductor laser diode portion nearest said substrate, wherein
said cavity extends in a first direction,
said first direction is parallel to said surface of said substrate,
a length in a second direction of said substrate is larger than a length in said second direction of said first semiconductor laser diode portion,
said second direction is parallel to said surface of said substrate,
said second direction intersects with said first direction,
said first surface of said first semiconductor laser diode portion has a protruding portion, made of semiconductor, protruding in said second direction,
a width of said first surface other than said protruding portion is smaller than a width of said first surface including said protruding portion in a plane parallel to said first direction and said second direction,
a metal wire is wire-bonded onto said electrode layer, and
a wire-bonded portion of said metal wire is positioned over said protruding portion.

4. The semiconductor laser diode apparatus according to claim 3, further comprising a dielectric multilayer film formed so as to extend along cavity facets of said first semiconductor laser diode portion and side end surfaces of said substrate substantially parallel to said cavity facets.

5. The semiconductor laser diode apparatus according to claim 1, wherein
said substrate is a substrate on which a second semiconductor laser diode portion is formed, and
said first semiconductor laser diode portion is bonded to said second semiconductor laser diode portion of said substrate.

6. The semiconductor laser diode apparatus according to claim 1, wherein
a projecting portion is formed on said surface of said substrate, and said first semiconductor laser diode portion is bonded to said projecting portion.

7. The semiconductor laser diode apparatus according to claim 3, wherein
said substrate and said first semiconductor laser diode portion are bonded to each other through an adhesive layer.

8. The semiconductor laser diode apparatus according to claim 1, wherein
a cavity facet of said first semiconductor laser diode portion is formed to coincide with a side end surface of said substrate.

9. The semiconductor laser diode apparatus according to claim 3, wherein
a cavity facet of said first semiconductor laser diode portion is formed to coincide with a side end surface of said substrate.

10. The semiconductor laser diode apparatus according to claim 1, wherein
an insulating film is formed on a side surface of said first semiconductor laser diode portion and said surface of said substrate, and said electrode layer is formed on said insulating film.

11. The semiconductor laser diode apparatus according to claim 3, wherein
an insulating film is formed on a side surface of said first semiconductor laser diode portion and said surface of said substrate, and said electrode layer is formed on said insulating film.

* * * * *